United States Patent
Wada

[19]

[11] Patent Number: 6,087,256
[45] Date of Patent: Jul. 11, 2000

[54] METHOD FOR MANUFACTURING MODIFIED T-SHAPED GATE ELECTRODE

[75] Inventor: Shigeki Wada, Tokyo, Japan

[73] Assignee: NEC Corporation, Japan

[21] Appl. No.: 08/992,766

[22] Filed: Dec. 17, 1997

[30]   Foreign Application Priority Data

Dec. 18, 1996   [JP]   Japan ..................................... 8-338431

[51] Int. Cl.[7] ................................................ H01L 21/44
[52] U.S. Cl. ........................... 438/666; 257/66; 257/280; 257/413; 257/472; 438/761
[58] Field of Search ................. 437/44, 41, 40; 257/66, 21, 412, 280, 413; 156/643; 357/15, 30; 438/666

[56]   References Cited

U.S. PATENT DOCUMENTS

| | | | |
|---|---|---|---|
| 4,377,438 | 3/1983 | Moriya et al. | 156/643 |
| 4,845,534 | 7/1989 | Fukuta | 357/15 |
| 5,040,041 | 8/1991 | Yamada et al. | 357/30 |
| 5,256,585 | 10/1993 | Bae | 437/44 |
| 5,259,923 | 11/1993 | Hori | 156/643 |
| 5,356,515 | 10/1994 | Tahara et al. | 156/643 |
| 5,370,973 | 12/1994 | Nishii | 430/315 |
| 5,399,896 | 3/1995 | Oku | 257/412 |
| 5,436,205 | 7/1995 | Hirose | 437/5 |
| 5,436,489 | 7/1995 | Murase | 257/401 |
| 5,563,079 | 10/1996 | Shin et al. | 437/40 |
| 5,567,647 | 10/1996 | Takahashi | 437/177 |
| 5,864,151 | 1/1999 | Yamazaki et al. | 257/66 |

FOREIGN PATENT DOCUMENTS

| | | |
|---|---|---|
| 63-137481 | 6/1988 | Japan . |
| 63-273363 | 11/1988 | Japan . |
| 3-171635 | 7/1991 | Japan . |

*Primary Examiner*—Matthew Smith
*Assistant Examiner*—Victor Yevsikov
*Attorney, Agent, or Firm*—Hayes, Soloway, Hennessey, Grossman & Hage, P.C.

[57]   ABSTRACT

In a method for manufacturing a semiconductor device, an insulating layer is formed on a semiconductor substrate, and a refractory metal is formed layer on the insulating layer. Then, a first opening is perforated in the refractory metal layer, and a part of the insulating layer is etched by using the refractory metal as a mask. Then, a second opening is perforated in the refractory metal layer. The second opening is superposed onto the first opening and is larger than the first opening. Then, the insulating layer is again etched by using the refractory metal layer as a mask, so that a T-shaped opening is perforated in the insulating layer. Finally, a modified T-shaped gate metal electrode is formed on the insulating layer having the T-shaped opening.

20 Claims, 33 Drawing Sheets

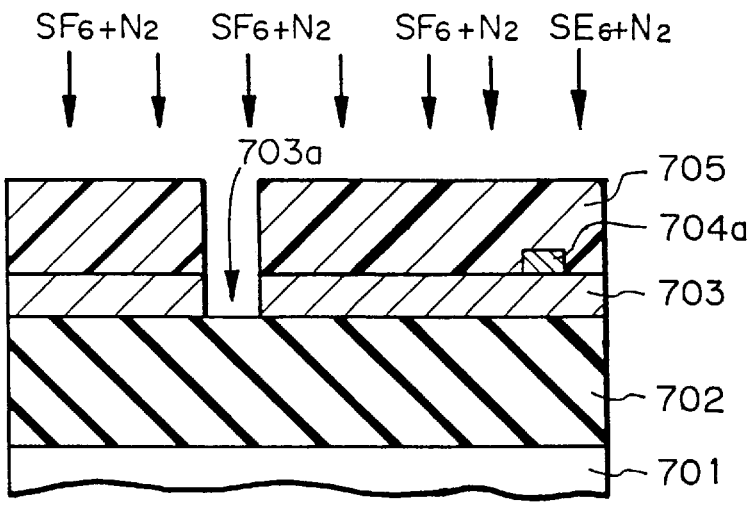
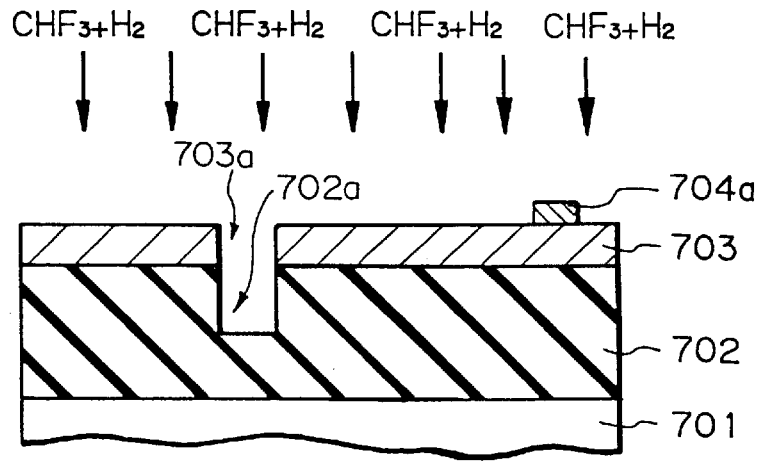
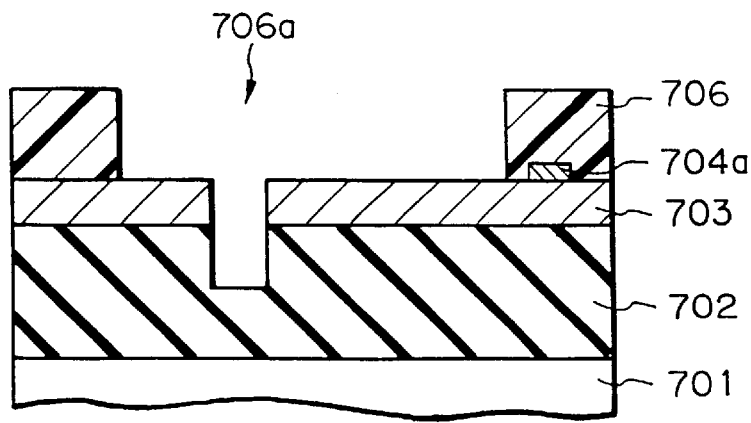

METHOD FOR MANUFACTURING MODIFIED T-SHAPED GATE ELECTRODE

BACKGROUND OF THE INVENTION

1. Field of the Invention

The present invention relates to a method for manufacturing a semiconductor device, particularly, a modified T-shaped gate electrode.

2. Description of the Related Art

In a field effect transistor, the gate length has been reduced to improve the high frequency performance. That is, when the gate length is reduced, the transit time of carriers within a semiconductor layer is reduced, so that a current cut off frequency $f_t$ is increased, thus improving the high frequency performance.

On the other hand, the reduction of the gate length increases the resistance of a gate electrode.

In order to reduce the resistance of a gate electrode, a T-shaped gate electrode has been developed.

In a first prior art method for manufacturing a T-shaped gate electrode, an insulating layer is formed on a semiconductor substrate, and a gate opening is perforated in the insulating layer. Then, a T-shaped gate electrode is formed on the insulating layer having the opening. This will be explained later in detail.

In the first prior art method, however, when the gate length is reduce to increase an aspect ratio of the gate opening, a shadowing effect is caused. As a result, a cavity is generated in the gate electrode. Also, if a gate recess portion is formed in the semiconductor substrate, a disconnection occurs in the gate electrode.

In a second prior art method for manufacturing a semiconductor device, the insulating layer of the first prior art method is made thin to reduce the aspect ratio. Thus, the gate electrode is easily buried in the opening of the insulating layer, to thereby avoid the shadowing effect. This will also be explained later in detail.

In the second prior art method, however, since the insulating layer is thin, a parasitic capacitance formed by the fringe portions of the T-shaped gate electrode and the semiconductor substrate is increased, so that the high frequency performance is deteriorated.

In a third prior art method for manufacturing a semiconductor device (see: JP-A-63-273363), a sidewall silicon nitride layer is formed within the opening of the insulating layer of the first prior art method, and then, a gate electrode is buried in the opening of the insulating layer. Thus, the aspect ratio of the T-shape electrode is substantially decreased. In addition, since the silicon insulating layer under the fringe portions of the T-shaped gate electrode is thick, a parasitic capacitance formed by the fringe portions of the T-shaped gate electrode layer and the semiconductor substrate is decreased, so that the high frequency performance is improved. This will also be explained later in detail.

In the third prior art method, however, particularly, when the gate length becomes smaller than 0.25 µm, it is difficult to deposit the silicon nitride layer homogenously within the opening of the insulating layer. That is, the silicon nitride layer overhangs the opening. As a result, a desirable shape of the sidewall silicon nitride layer cannot be formed, and accordingly, a desirable T-shape of the gate electrode cannot be obtained.

SUMMARY OF THE INVENTION

It is an object of the present invention to provide a method for manufacturing a semiconductor device where a T-shaped gate electrode can formed without creating voids and disconnections therein and a parasitic capacitance of the T-shaped gate electrode can be reduced.

According to the present Invention, in a method for manufacturing a semiconductor device, an insulating layer is formed on a semiconductor substrate, and a refractory metal is formed layer on the insulating layer. Then, a first opening is perforated in the refractory metal layer, and a part of the insulating layer is etched by using the refractory metal as a mask. Then, a second opening is perforated in the refractory metal layer. The second opening is superposed onto the first opening and is larger than the first opening. Then, the insulating layer is again etched by using the refractory metal layer as a mask, so that a T-shaped opening is perforated in the insulating layer. Finally, a modified T-shaped gate metal electrode is formed on the insulating layer having the T-shaped opening. Thus, the modified T-shaped gate electrode is different from the prior art T-shaped gate electrode.

BRIEF DESCRIPTION OF THE DRAWINGS

The present invention will be more clearly understood from the description as set forth below, in comparison with the prior art, with reference to the accompanying drawings, wherein:

FIGS. 7A through 7K are cross-sectional views for explaining a second embodiment of the method for manufacturing a semiconductor device according to the present invention;

DESCRIPTION OF THE PREFERRED EMBODIMENTS

Before the description of the preferred embodiments, prior art methods for manufacturing a semiconductor device will be explained with reference to FIGS. 1A through 1H, 2A, 2E, 3 and 4A through 4I.

FIGS. 1A through 1H are cross-sectional views for explaining a first prior art method for manufacturing a semiconductor device.

Figure 1A:
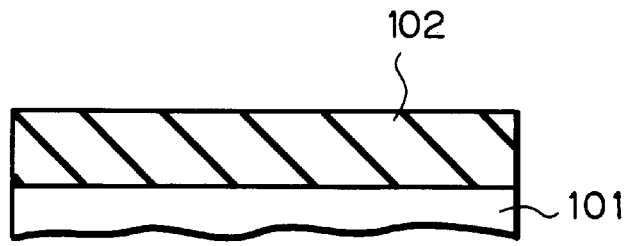
FIGS. 1A through 1G are cross-sectional views for explaining a first prior art method for manufacturing a semiconductor device.

First, referring to FIG. 1A, an about 0.3 µm thick silicon oxide layer 102 is formed on a semiconductor substrate 101 where active regions are already formed.

Figure 1B:
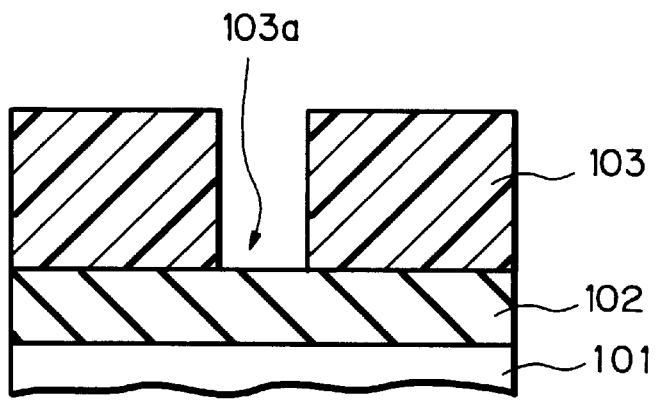

Next, referring to FIG. 1B, a photoresist pattern 103 having an opening 103a is coated on the silicon oxide layer 102 by a photolithography process.

Figure 1C:
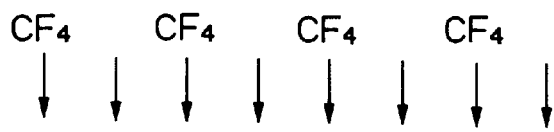
Figure 1C:
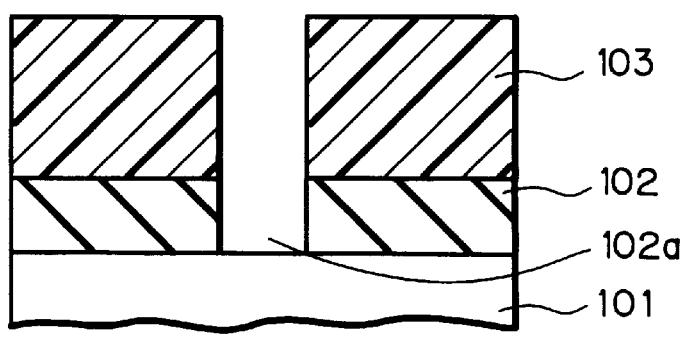

Next, referring to FIG. 1C, the silicon oxide layer 102 is etched by a reactive ion etching process using $CF_4$ gas, so that an opening 102a is perforated in the silicon oxide layer 102. Then, the photoresist pattern 103 is removed.

Figure 1D:
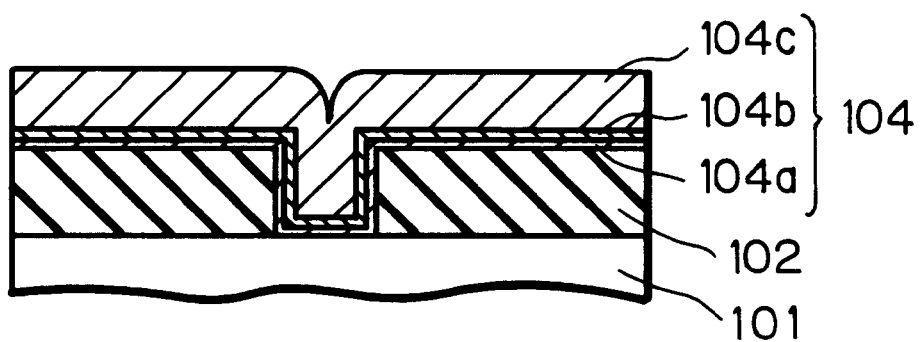

Next, referring to FIG. 1D, an about 50 nm thick tungsten silicide (WSi) layer 104a, an about 30 nm thick titanium (Ti) layer 104b and an about 300 nm thick gold (Au) layer 104c are sequentially deposited on the entire surface by a sputtering process, to thereby form a gate metal layer 104.

Figure 1E:
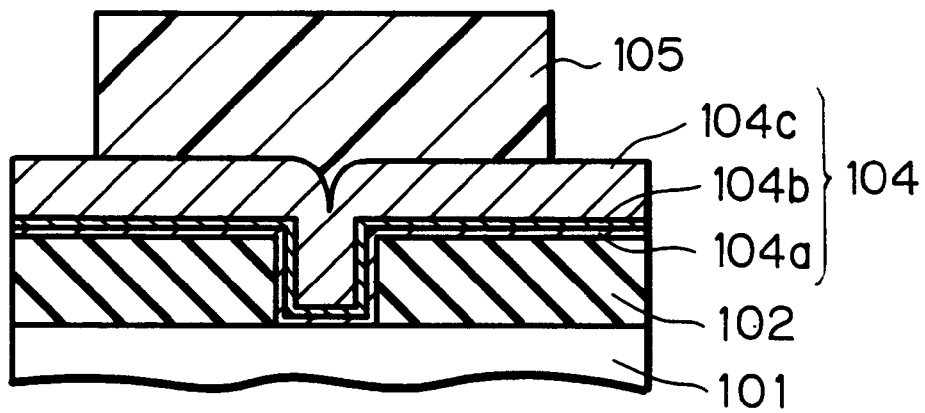

Next, referring to FIG. 1E, a photoresist pattern 105 is coated on the gate metal layer 104 by a photolithography process.

Figure 1F:
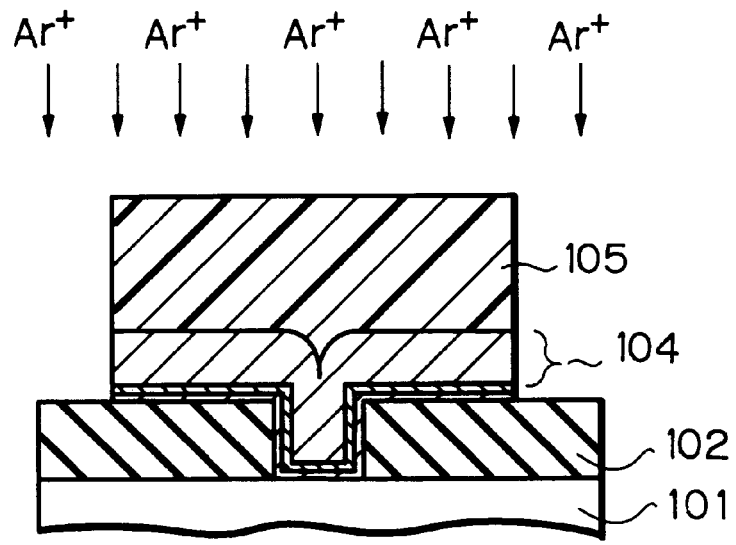

Next, referring to FIG. 1F, the gate metal layer 104 is etched by an ion milling process using Ar ions.

Figure 1G:
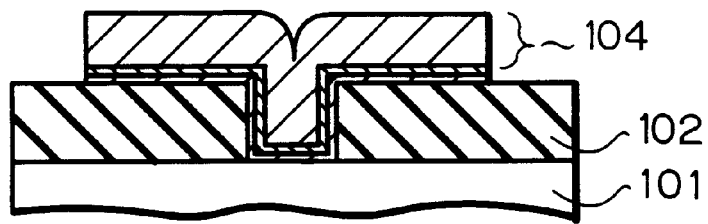

Finally, referring to FIG. 1G, the photoresist pattern 105 is removed. Thus, the gate metal layer 104 becomes T-shaped.

Figure 2A:
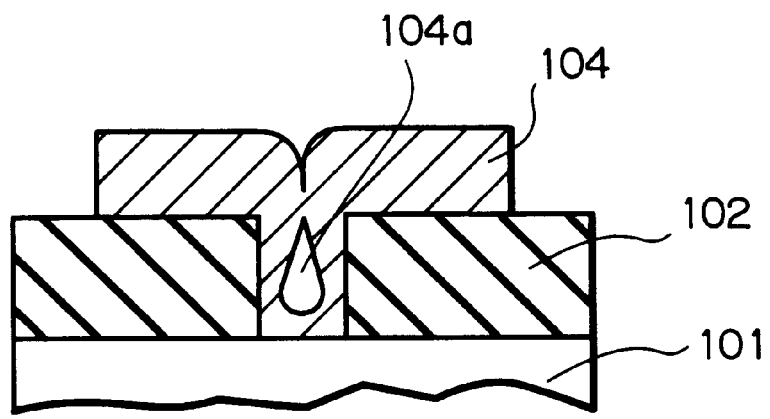
FIGS. 2A and 2B are cross-sectional views for explaining problems caused by the first embodiment as illustrated in FIGS. 1A through 1G.
Figure 2B:
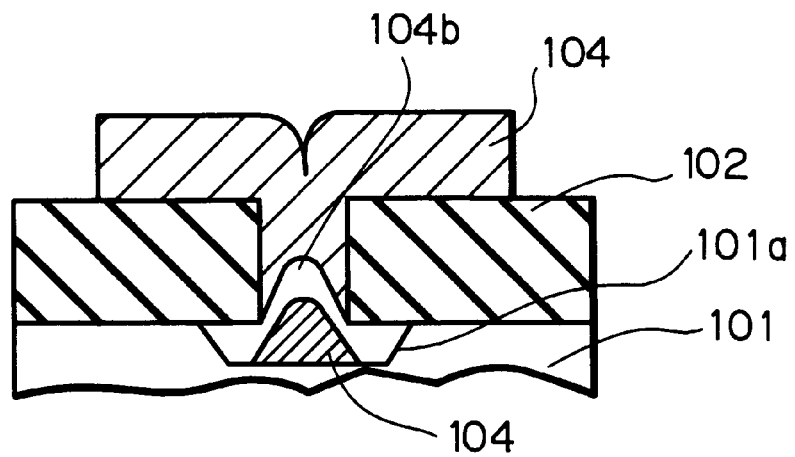

In the first prior art method as illustrated in FIGS. 1A through 1H, however, when the gate length is reduced to increase an aspect ratio, a shadowing effect is caused. As a result, as illustrated in FIG. 2A, a cavity 104a is generated in the gate metal layer 104. Also, as illustrated in FIG. 2B, if a gate recess portion 101a is formed in the semiconductor substrate 101, a disconnection as indicated by 104b occurs in the gate metal layer 104.

Figure 3:
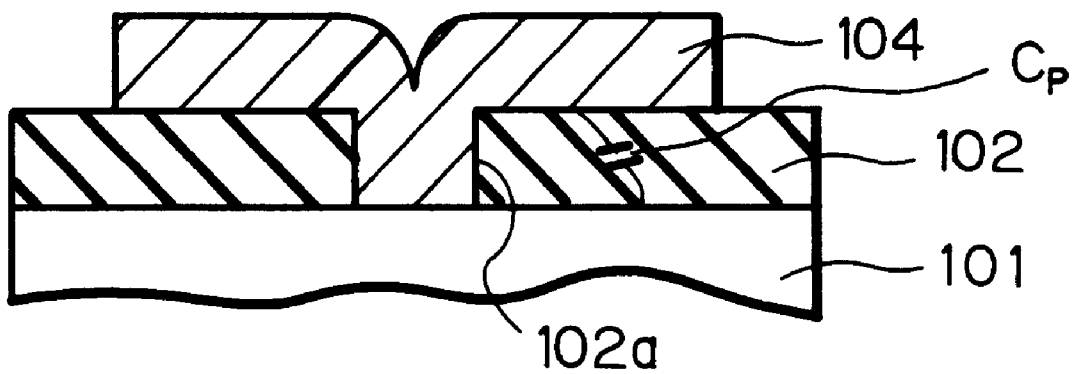
FIG. 3 is a cross-sectional view for an increased gate fringing capacitance in a second prior art method.

In FIG. 3, which illustrates a second prior art method for manufacturing a semiconductor device, the silicon oxide layer 102 of FIGS. 1A through 1G is made thin to reduce the aspect ratio. Thus, the gate metal layer 104 is easily buried in the opening 102a of the silicon oxide layer 102, to thereby avoid the shadowing effect.

In the second prior art method as illustrated in FIG. 3, however, since the silicon oxide layer 102 is thin, a parasitic capacitance $C_p$ formed by the fringe portions of the T-shaped gate metal layer 104 and the semiconductor substrate 101 is increased, so that the high frequency performance is deteriorated.

FIGS. 4A through 4I are cross-sectional views for explaining a third prior art method for manufacturing a semiconductor device (see: JP-A-63-273363).

Figure 4A:
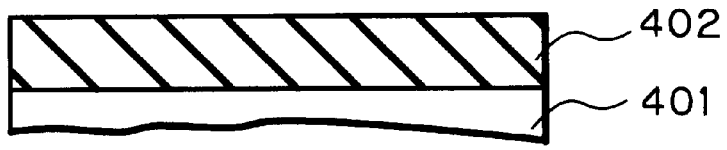
FIGS. 4A through 4I are cross-sectional views for explaining a third prior art method for manufacturing a semiconductor device.
Figure 4B:
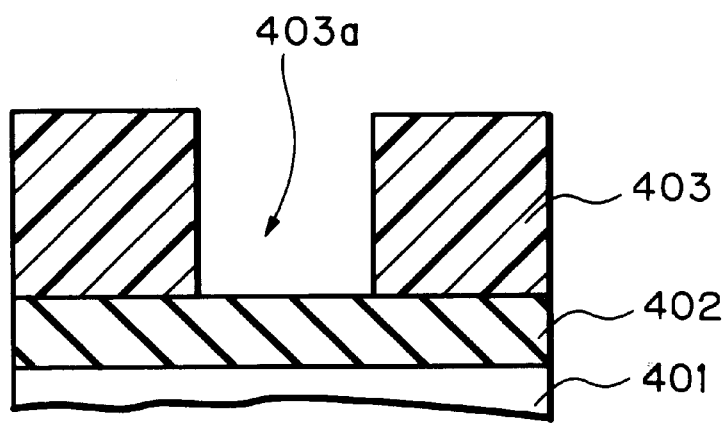

First, referring to FIG. 4A, in the same way as in FIG. 1A, an about 0.3 µm thick silicon oxide layer 402 is formed on a semiconductor substrate 401 where active regions are already formed.

Next, referring to FIG. 4S, in the same way as in FIG. 1B, a photoresist pattern 103 having an opening 103a is coated on the silicon oxide layer 402 by a photolithography process.

Figure 4C:
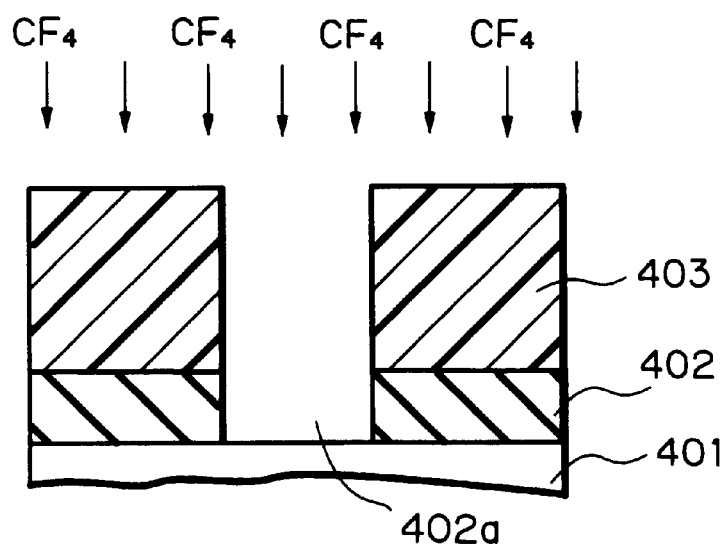
Figure 4D:
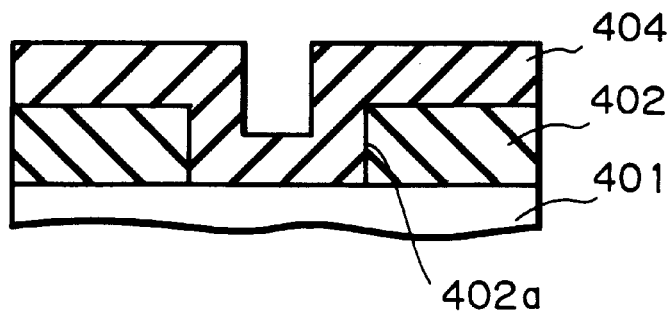

Next, referring to FIG. 4C, in the same way as in FIG. 1C, the silicon oxide layer 402 is etched by a reactive ion etching process using $CF_4$ gas, so that an opening 402a is perforated in the silicon oxide layer 402. Then, the photoresist pattern 403 is removed. Next, referring to FIG. 4D, an about 0.4 µm thick silicon nitride layer 404 is deposited by a chemical vapor deposition (CVD) process using plasma gas.

Figure 4E:
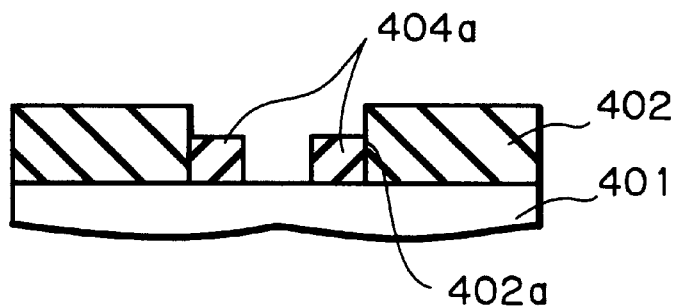

Next, referring to FIG. 4E, the silicon nitride layer 404 is etched back by a reactive ion etching process using a mixture gas of $CF_4$ and $O_2$ (or $H_2$). As a result, a sidewall silicon nitride layer 404a is left in the opening 402a.

Figure 4F:
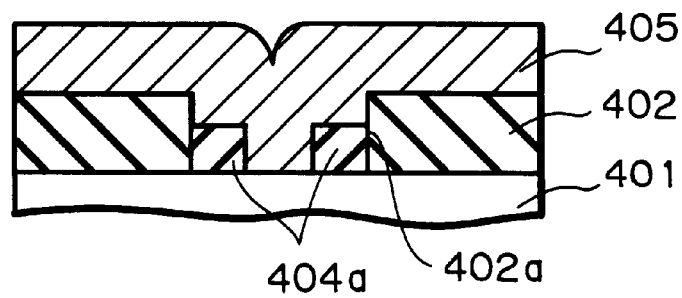

Next, referring to FIG. 4F, in the same way as in FIG. 1D, a gate metal layer 104 made of WSi (50 nm)/Ti (30 nm)/Au (300 nm) is deposited on the entire surface by a sputtering process.

Figure 4G:
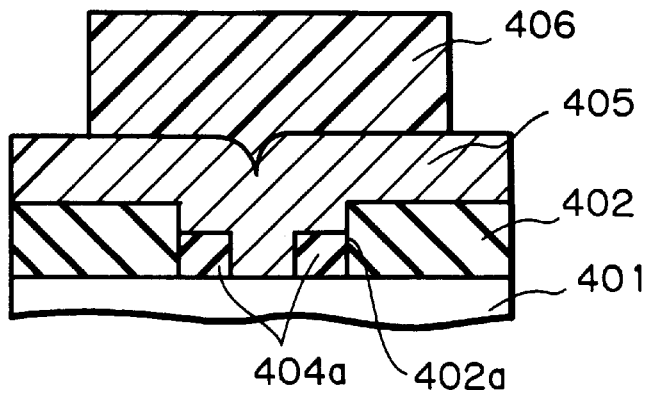

Next, referring to FIG. 4G, in the same way as in FIG. 1E, a photoresist pattern 406 is coated on the gate metal layer 405 by a photolithography process.

Figure 4H:
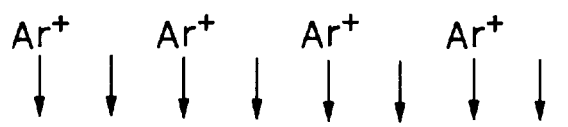
Figure 4H:
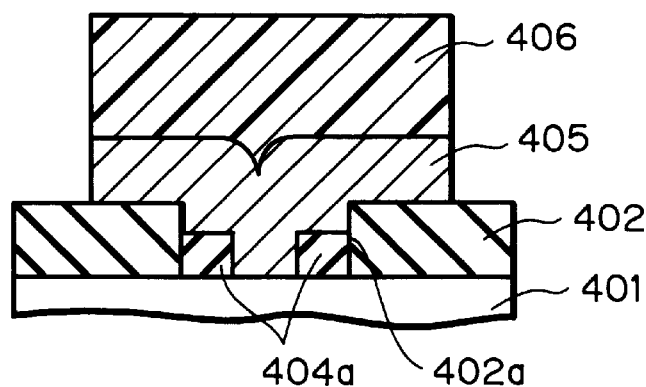

Next, referring to FIG. 4H, in the same way as in FIG. 1F, the gate metal layer 404 is etched by an ion milling process using Ar ions.

Figure 4I:
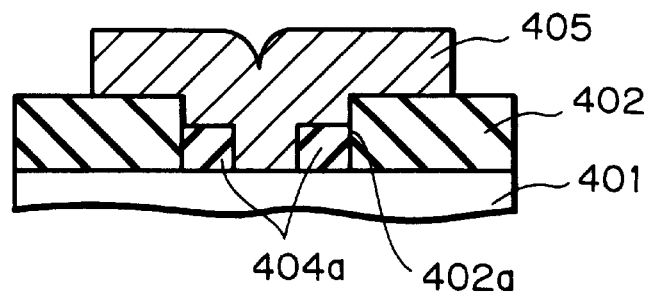

Finally, referring to FIG. 4I, in the same way as in FIG. 1H, the photoresist pattern 406 is removed. Therefore, the gate metal layer 405 becomes T-shaped.

Thus, the aspect ratio of the T-shape gate metal layer 405 is substantially decreased. In addition, since the silicon oxide layer 402 under the fringe portions of the T-shaped gate metal layer 405 is thick, a parasitic capacitance C, formed by the fringe portions of the T-shaped gate metal layer 405 and the semiconductor substrate 401 is decreased, so that the high frequency performance is improved.

Figure 5:
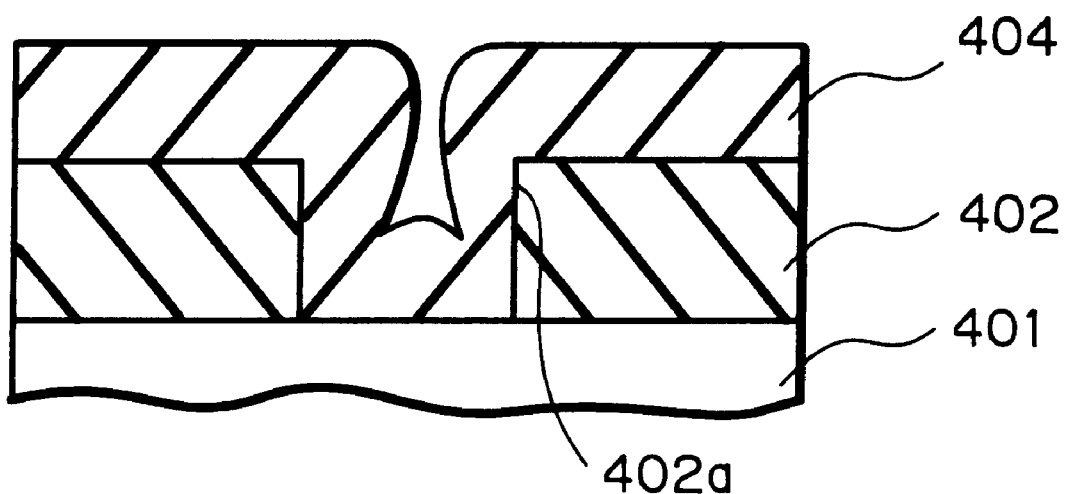
FIG. 5 is a cross-sectional view for explaining problems caused by the third embodiment as illustrated in FIGS. 4A through 4I.

In the third prior art method as illustrated in FIGS. 4A through 4I, however, particularly, when the gate length becomes smaller than 0.25 µm, it is difficult to deposit the silicon nitride layer 404 homogenously within the opening 402a of the silicon oxide layer 402. That is, as illustrated in FIG. 5 which corresponds to FIG. 4D, the silicon nitride layer 404 overhangs the opening 402a. As a result, even after the back-etching process, a desirable shape of the sidewall silicon nitride layer 404 cannot be formed, and accordingly, a desirable T-shape of the gate metal layer 405 cannot be obtained.

FIGS. 6A through 6K are cross-sectional views for explaining a first embodiment of the method for manufacturing a semiconductor device according to the present invention.

Figure 6A:
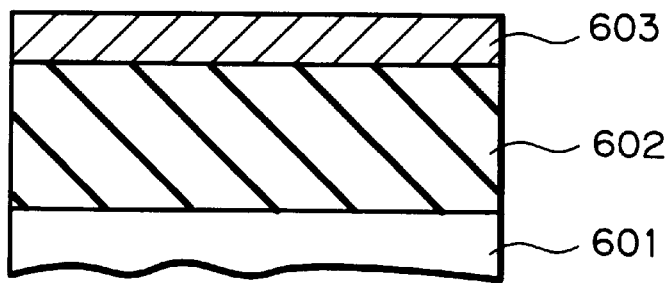
FIGS. 6A through 6K are cross-sectional views for explaining a first embodiment of the method for manufacturing a semiconductor device according to the present invention.

First, referring to FIG. 6A, an about 300 nm thick silicon oxide layer 602 is deposited on a semiconductor substrate 601 where active regions are already formed by a thermal chemical vapor deposition (CVD) process. Then, an about 70 nm thick tungsten (W) layer 603 is deposited on the silicon oxide layer 602 by a sputtering process.

Figure 6B:
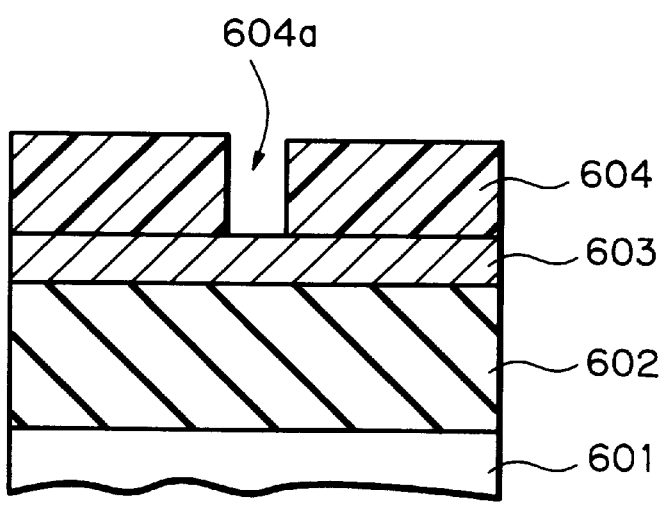

Next, referring to FIG. 6B, an about 200 nm thick photoresist pattern 604 made of polymethyl methacrylate (PMMA) having an opening 604a is coated on the W layer 603. In this case, the opening 604a has a length of about 0.1 µm, and is formed by an electron-beam exposure system or an X-ray exposure system.

Figure 6C:
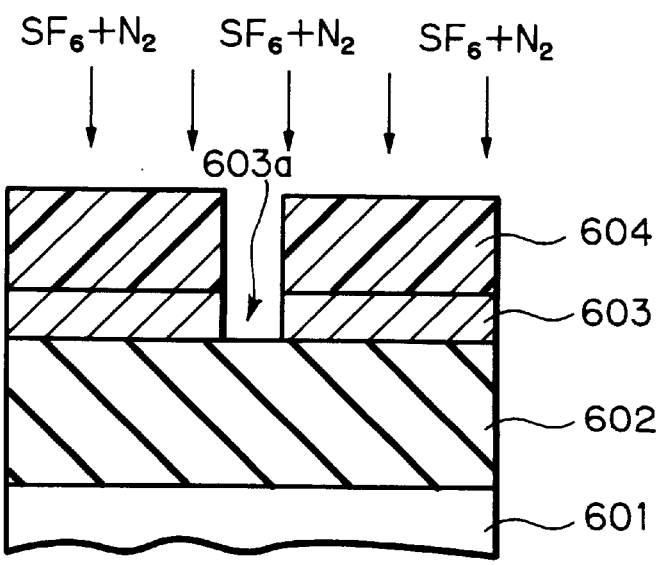

Next, referring to FIG. 6C, the W layer 603 is etched by a dry etching process using a mixture gas of $SF_6$ and $N_2$ where the gas flow rate of $N_2/(SF_6+N_2)$ is 20 percent, the power is 50 W and the gas pressure is 3 mTorr. As a result, an opening 603a is perforated in the W layer 603. Note that the sides of the W layer 603 is hardly etched due to the isotropic etching effect enhanced by $N_2$ gas. In addition, the etching rate ratio of W to PMMA is very large, and therefore, the photoresist pattern 604 is also hardly etched. However, note that $SF_6$ gas can be used instead of the mixture gas of $SF_6$ and $N_2$. Then, the photoresist pattern 604 is removed by using a dry etching process using oxygen plasma.

Figure 6D:
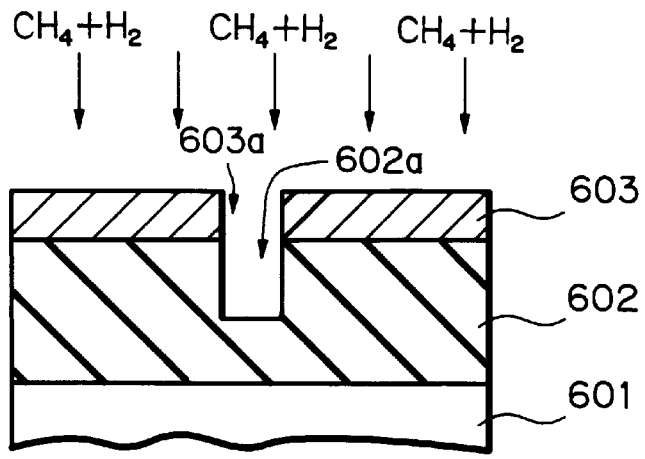

Next, referring to FIG. 6D, a part of the silicon oxide layer 602 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that an opening 602a having a depth of about 150 nm is perforated in the silicon oxide layer 602. In this case, $H_2$ gas reduces fluorine radicals (F-radicals) in $CF_4$ plasma gas to reduce the etching rate of W. As a result, the etching rate ratio of the silicon oxide layer 602 to the W layer 603 is larger than 10/1. Therefore, since the W layer 603 is hardly etched, the w layer 603 can be thin, so that an aspect ratio of the opening 602a including the opening 603a of the W layer 603 can be reduced. This can suppress the reduction of the etching rate of the silicon oxide layer 602 as compared with the prior art methods where a photoresist pattern is directly used to etch the silicon oxide layers 102 and 402 of FIGS. 1A through 1H and FIGS. 4A through 4I.

Figure 6E:
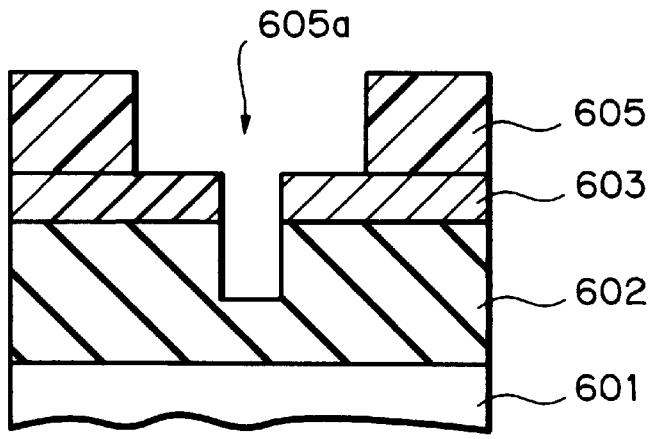

Next, referring to FIG. 6E, an about 300 nm thick photoresist pattern 605 made of PMMA having an opening 605a is again coated on the W layer 603. In this case, the opening 605a has a length of about 0.4 $\mu$m, and is formed by an electron-beam exposure system or an X-ray exposure system.

Figure 6F:
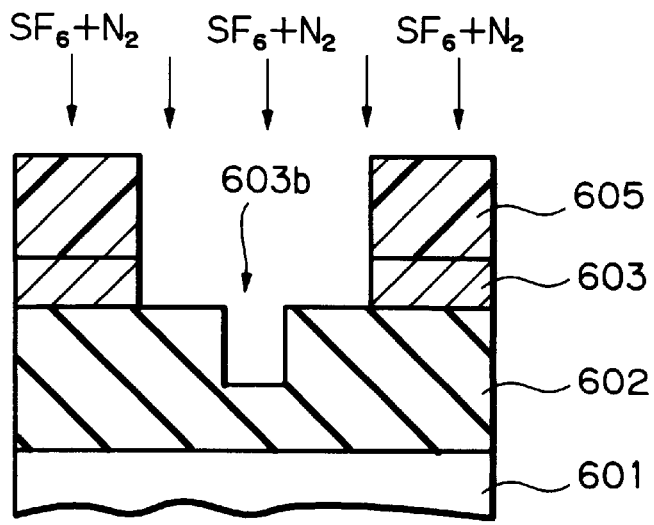

Next, referring to FIG. 6F, the W layer 603 is etched by a dry etching process using a mixture gas of $SF_6$ and $N_2$ where the gas flow rate of $N_2/(SF_6+N_2)$ is 20 percent, the power is 50 W and the gas pressure is 3 mTorr. As a result, an opening 603b larger than the opening 603a is perforated in the W layer 603. Then, the photoresist pattern 605 is removed by using a dry etching process using oxygen plasma.

Figure 6G:
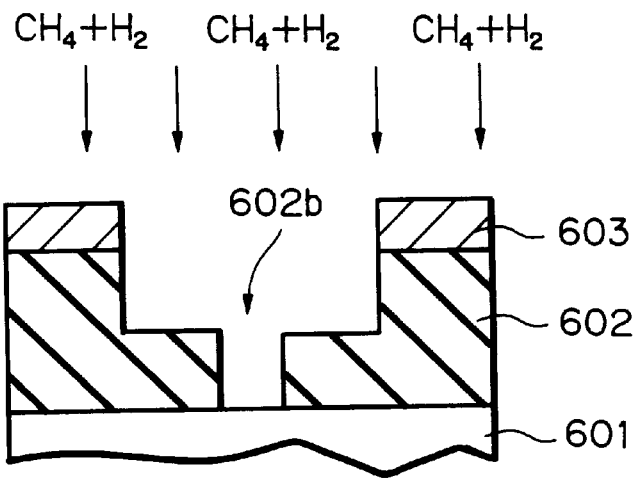

Next, referring to FIG. 6G, the silicon oxide layer 602 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that a T-shaped opening 602b is perforated in the silicon oxide layer 602.

Figure 6H:
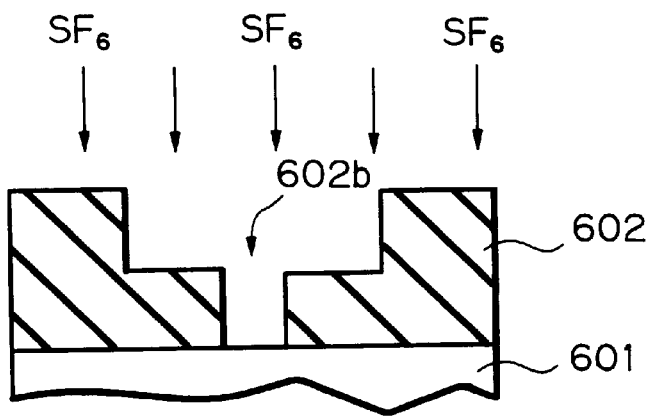

Next, referring to FIG. 6H, the W layer 603 is removed by a dry etching process using $SF_6$ gas.

Figure 6I:
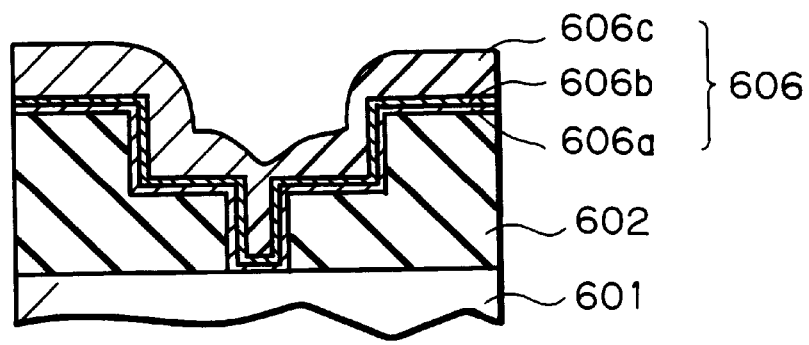

Next, referring to FIG. 6I, an about 35 nm thick WSi layer 606a, an about 30 nm thick Ti layer 606b and an about 300 nm thick Au layer 606c are sequentially deposited on the entire surface by a sputtering process to form a gate metal layer 606.

Figure 6J:
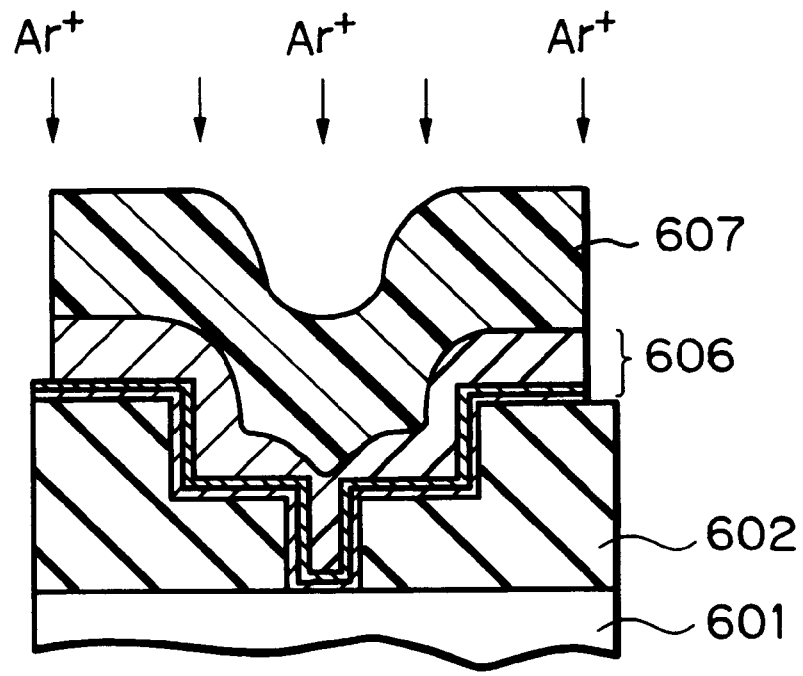

Next, referring to FIG. 6J, a photoresist pattern 607 is coated on the gate metal layer 606, and then, the gate metal layer 606 is etched by an ion milling process using the photoresist pattern 607 as a mask.

Figure 6K:
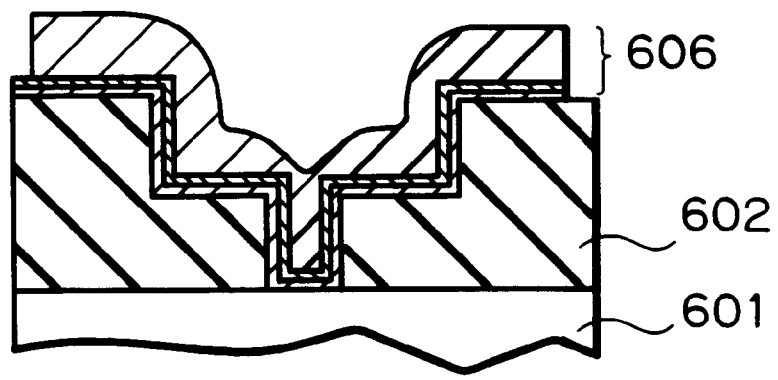

Finally, referring to FIG. 6K, the photoresist pattern 607 is removed, and thus, the gate metal layer 606 is of a modified T-shape.

In the first embodiment as illustrated in FIGS. 6A through 6K, in the lower portion of the opening 602b, the length is about 0.1 $\mu$m and the height is about 0.1 $\mu$m, and in this case, the aspect ratio of the lower portion of the opening 602b is about 1. On the other hand, the aspect ratio of the upper portion of the opening 602b is about 0.5. Therefore, the gate metal layer 606 is easily buried in the opening 602b of the silicon oxide layer 602 without causing the shadowing effect, i.e., causing cavity and disconnections as in the prior art. Also, since the silicon oxide layer 602 can be thick, a parasitic capacitance formed by the fringe portions of the modified T-shaped gate metal layer 606 and the semiconductor substrate 601 can be decreased, thus suppressing the deterioration of the high frequency performance. Further, since the W layer 603 has an etching selectivity over the silicon oxide layer 602, a desirable shape of the gate metal layer 606 can be obtained.

In the first embodiment, note that the W layer 603 can be replaced by another refactory metal layer made of molybdenum (Mo), tungsten alloy such as TiW, WSi, WSiN or WN or molybdenum alloy. Also, in the steps as illustrated in FIGS. 6D and 6G, a mixture gas of fluorocarbon such as $C_3F_8$ and $C_2F_6$ and hydrogen, a mixture gas of hydrofluorocarbon such as $CHF_3$ and hydrogen, a gas of hydrofluorocarbon or a fluorocarbon gas can be used as an etching gas having a large etching rate ratio of insulator made of silicon oxide, silicon nitride (SiN) or silicon oxide nitride (SiON) to refractory metal. Note that the layer 602 can be made of SiN or SiON.

FIGS. 7A through 7K are cross-sectional views for explaining a second embodiment of the method for manufacturing a semiconductor device according to the present invention.

Figure 7A:
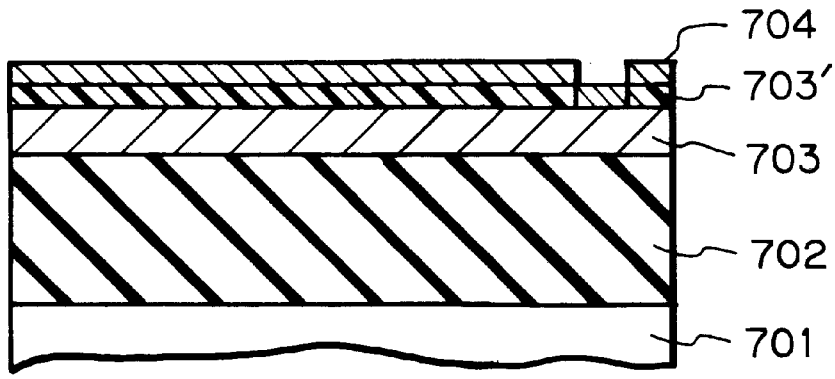

First, referring to FIG. 7A, an about 300 nm thick silicon oxide nitride layer 702 is deposited on a semiconductor substrate 701 where active regions are already formed by a thermal CVD process. Then, an about 60 nm thick Mo layer 703 is deposited on the silicon oxide nitride layer 702 by an electron-beam gun evaporation process. Then, a photoresist pattern 703' having an opening is coated on the Mo layer 703. Then, an about 35 nm thick titanium layer and an about 100 nm thick gold (Au) layer are sequentially deposited on the Mo layer 703 by an evaporation process, and are lifted off to form a Ti/Au layer 704.

Figure 7B:
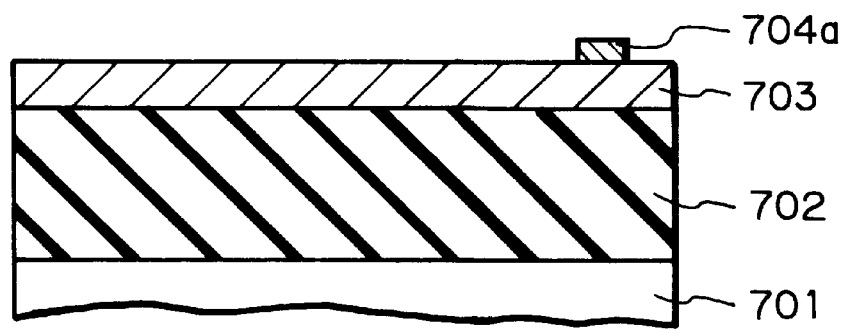

Next, referring to FIG. 7B, the photoresist pattern 703' is removed, so that the Ti/Au layer 704 on the photoresist pattern 703' is lifted off, so that an alignment mark 704a for an optical stepper is formed.

Figure 7C:
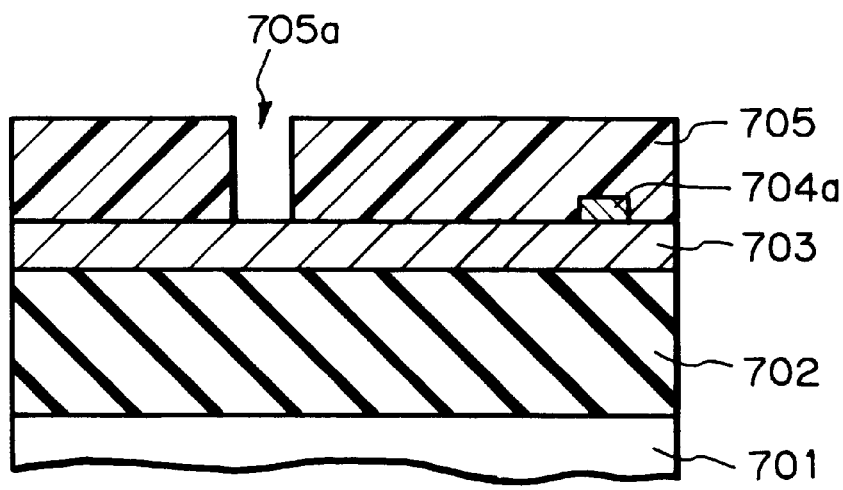

Next, referring to FIG. 7C, an about 250 nm thick photoresist layer 705 is coated on the Mo layer 703. Then, an opening 705a is perforated in the photoresist layer 705 by an electron-beam or X-ray depiction and development process using the alignment mark 704a. In this case, the opening 705a has a length of about 0.15 $\mu$m.

Next, referring to FIG. 7D, the Mo layer 703 is etched by a dry etching process using $SF_6$ gas where the power is 50 W and the gas pressure is 3 mTorr. As a result, an opening 703a is perforated in the Mo layer 703. In this case, the etching rate ratio of Mo to photoresist is very large, and therefore, the photoresist layer 705 is also hardly etched. However, note that a mixture gas of $SF_6$ and $N_2$ can be used instead of $SF_6$ gas. Then, the photoresist layer 705 is removed by using a dry etching process using oxygen plasma.

Next, referring to FIG. 7E, a part of the silicon oxide nitride layer 702 is etched by a dry etching process using a mixture gas of $CHF_3$ and $H_2$ where the gas flow rate of $H_2/(CHF_3+H_2)$ is 10 percent, the plasma power is 50 W and the gas pressure is 3 mTorr. That is, a reactive ion etching process is carried out, so that an opening 702a having a depth of about 150 nm is perforated in the silicon oxide nitride layer 702. In this case, $H_2$ gas reduces F-radicals in $CHF_3$ plasma gas to reduce the etching rate of Mo. As a result, the etching rate ratio of the silicon oxide nitride layer 702 to the Mo layer 703 becomes large. Therefore, since the Mo layer 703 is hardly etched, the Mo layer 703 can be thin, so that an aspect ratio of the opening 702a including the opening 703a of the Mo layer 703 can be reduced. This can suppress the reduction of the etching rate of the silicon oxide nitride layer 702 as compared with the prior art methods where a photoresist pattern is directly used to etch the silicon oxide layers 102 and 402 of FIGS. 1A through 1H and FIGS. 4K through 4I.

Next, referring to FIG. 7F, an about 700 nm thick photoresist layer 706 is again coated on the Mo layer 703. Then, an opening 706a is perforated in the silicon oxide nitride layer 702 by an electron-beam or X-ray depiction and development process in accordance with the alignment mark 704a. In this case, the opening 706a has a length of about 0.3 μm.

Note that since the opening 705a of the (electron-beam) photoresist layer 705 and the opening 706a of the (electron-beam) photoresist layer 706 are perforated by using the same alignment mark 704a, a relative misalignment between the openings 705a and 706a hardly occurs.

Figure 7G:
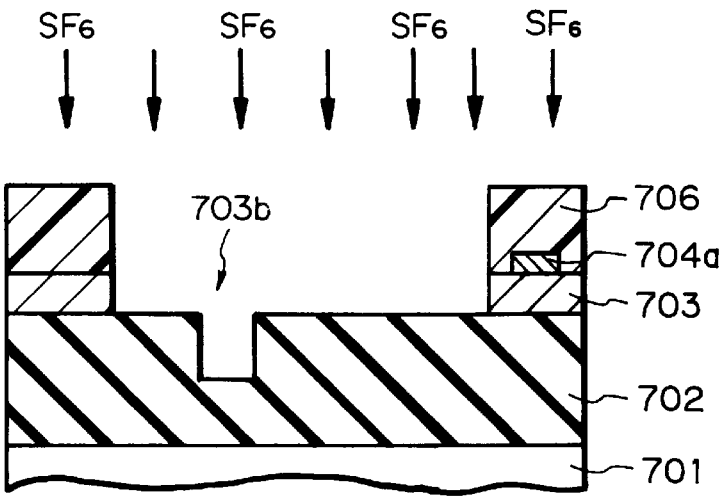

Next, referring to FIG. 7G, the Mo layer 703 is etched by a dry etching process using a mixture gas of $SF_6$ where the power is 50 W and the gas pressure is 3 mTorr. As a result, an opening 703b larger than the opening 703a is perforated in the Mo layer 703. Note that a mixture gas of $SF_6$ and $N_2$ can be used instead of the $SF_6$ gas. Then, the photoresist layer 706 is removed by using a dry etching process using oxygen plasma.

Figure 7H:
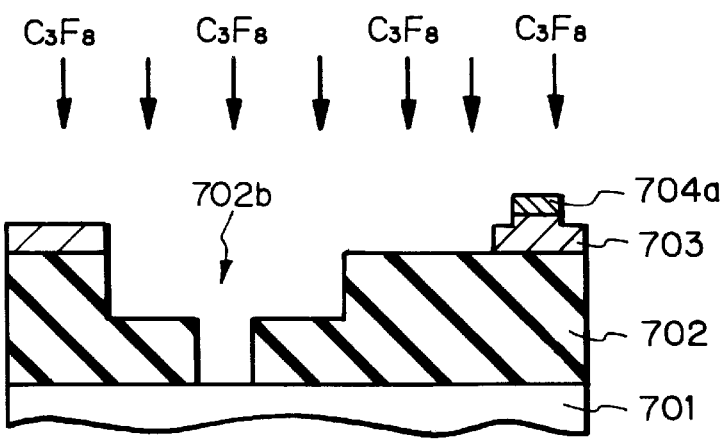

Next, referring to FIG. 7H, the silicon oxide nitride layer 702 is etched by a dry etching process using a mixture gas of $C_3F_8$ gas where the plasma power is 45 W and the gas pressure is 5 mTorr. That is, a reactive ion etching process is carried out, so that a T-shaped opening 702b is perforated in the silicon oxide nitride layer 702.

Figure 7I:
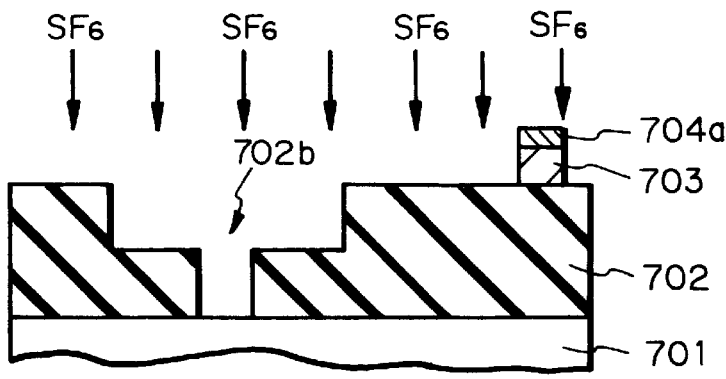

Next, referring to FIG. 7I, the Mo layer 703 is removed by a dry etching process using $SF_6$ gas. In this case, the alignment mark 704a is left.

Figure 7J:
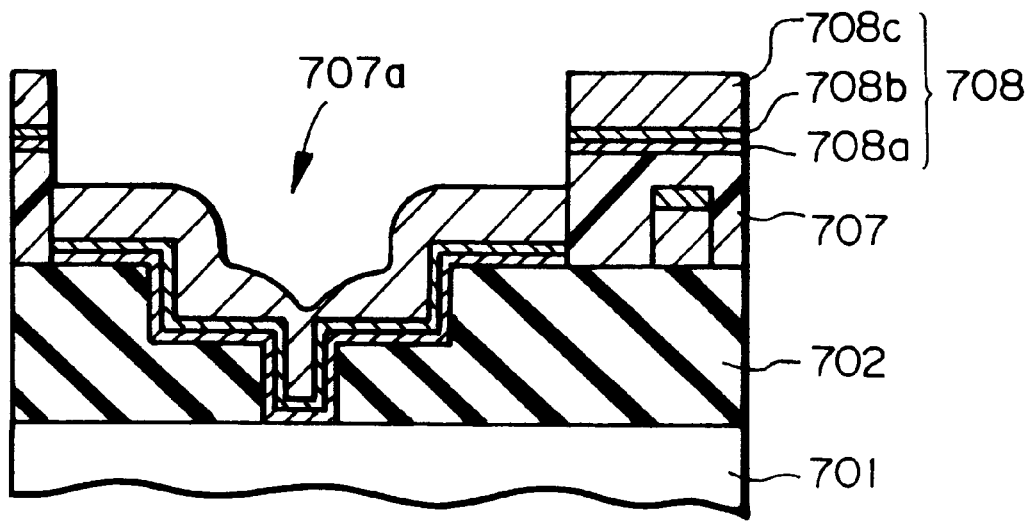

Next, referring to FIG. 7J, a photoresist pattern 707 is coated in accordance with the alignment mark 704a. In this case, an opening perforated in the photoresist pattern 707 has a lenght of about 0.8 μm. Note that since the opening 705a of the electron beam resist layer 705, the opening 706a of the electron beam resist layer 706, and the opening 707a of the photoresist layer 707 are perforated by the same alignment mark 704a, a relative misalignment among the openings 705a, 706a and 707a hardly occurs. Then, an about 50 nm thick Mo layer 708a, an about 15 nm thick Ti layer 708b and an about 300 nm thick Au layer 708c are sequentially deposited on the entire surface by an electron-beam gun evaporation process to form a gate metal layer 708.

Figure 7K:
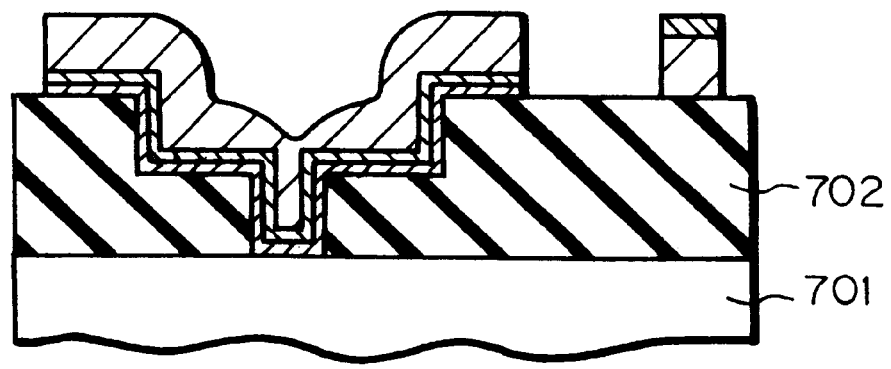

Finally, referring to FIG. 7K, the photoresist pattern 707 is removed, so that the gate metal layer 708 on the photoresist pattern 707 is lifted off. Thus, the gate metal layer 708 is of a modified T-shape.

In the second embodiment as illustrated in FIGS. 7A through 7K, in the lower portion of the opening 702b, the length is about 0.1 μm and the height is about 0.1 μm, and in this case, the aspect ratio of the lower portion of the opening 702b is about 1. On the other hand, the aspect ratio of the upper portion of the opening 702b is about 0.5. Therefore, the gate metal layer 708 is easily buried in the opening 702b of the silicon oxide nitride layer 702 without causing the shadowing effect, i.e., causing cavity and disconnections as in the prior art. Also, since the silicon oxide nitride layer 702 can be thick, a parasitic capacitance formed by the fringe portions of the modified T-shaped gate metal layer 708 and the semiconductor substrate 701 can be decreased, thus suppressing the deterioration of the high frequency performance. Further, since the Mo layer 703 has an etching selectivity over the silicon oxide nitride layer 702, a desirable shape of the gate metal layer 708 can be obtained.

In the second embodiment, note that the Mo layer 703 can be replaced by another refractory metal layer made of W, tungsten alloy such as TiW, WSi or WN, or molybdenum alloy. Also, in the steps as illustrated in FIGS. 7E and 7H, a mixture gas of other fluorocarbon and hydrogen, a gas of hydrofluorocarbon or a fluorocarbon gas can be used as an etching gas having a large etching rate ratio of insulator made of silicon oxide, silicon nitride (SiN) or silicon oxide nitride (SiON) to refractory metal. Note that the layer 702 can be made of $SiO_2$ or SiN.

FIGS. 8A through 8M are cross-sectional views for explaining a third embodiment of the method for manufacturing a semiconductor device according to the present invention. In FIGS. 8A through 8M, two kind elements such as an FET and a Schottky diode (SBD) are formed.

Figure 8A:
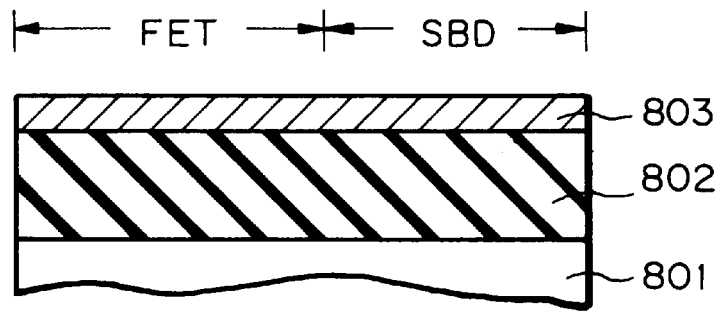
FIGS. 8A through 8M are cross-sectional views for explaining a third embodiment of the method for manufacturing a semiconductor device according to the present invention.

First, referring to FIG. 8A, an about 300 nm thick silicon oxide layer 802 is deposited on a semiconductor substrate 801 where active regions are already formed by a thermal CVD process. Then, an about 70 nm thick W layer 803 is deposited on the silicon oxide layer 802 by a sputtering process.

Figure 8B:
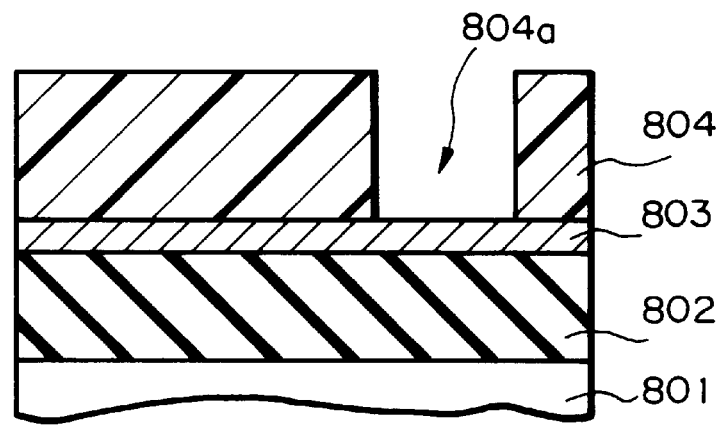
Figure 8C:
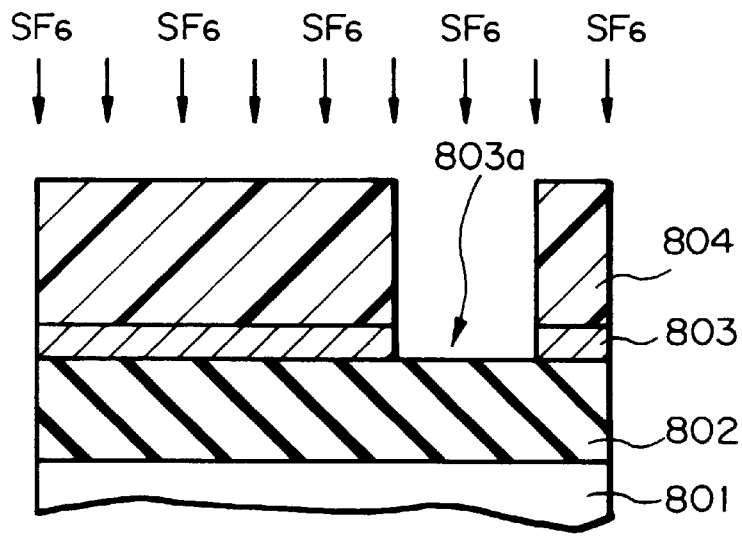

Next, referring to FIG. 8B, an about 200 nm thick photoresist pattern 804 having an opening 804a as well as a first cross opening (not shown) as an alignment mark is coated on the W layer 803. In this case, the opening 804a has a length of larger than 0.5 μm, and is formed by a photolithography process. Also, the first cross opening is formed on an isolated region of the semiconductor substrate 801.

Next, referring to FIG. BC, the W layer 803 is etched by a dry etching process using $SF_6$ gas where the power is 50 W and the gas pressure is 3 mTorr. As a result, an opening 803a as well as a second cross opening (not shown) corresponding to the first cross opening is perforated in the W layer 803. In this case, the etching rate ratio of W to PMMA is very large, and the photoresist pattern 804 is also hardly etched. Then, the photoresist pattern 804 is removed by using a dry etching process using oxygen plasma.

Figure 8D:
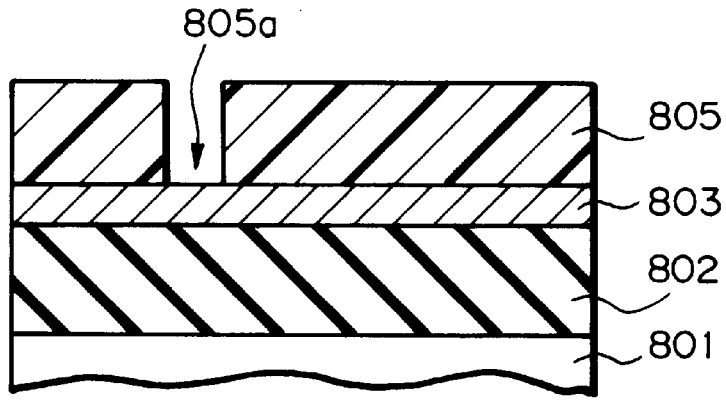
Figure 8E:
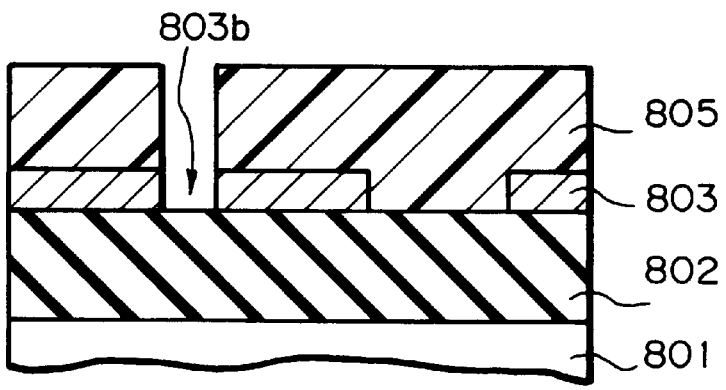

Next, referring to FIG. 8D, an about 250 nm thick photoresist pattern 805 made of PMMA having an opening 805a is coated on the W layer 803. In this case, the opening 605a has a length of about 0.12 μm, and is formed by an electron-beam exposure system and an X-ray exposure system in accordance with the opening 803a, i.e., the second cross opening as an alignment mark.

Next, referring to FIG. BE, the W layer 803 is etched by a dry etching process using a mixture gas of $SF_6$ and $N_2$ where the gas flow rate of $N_2/(SF_6+N_2)$ is 20 percent, the power is 70 W and the gas pressure is 3 mTorr. As a result, an opening 803b is perforated in the W layer 803. Note that the sides of the W layer 803 are hardly etched due to the isotropic etching effect enhanced by $N_2$ gas. In addition, the etching rate ratio of W to PMMA is very large, and therefore, the photoresist pattern 805 is also hardly etched. However, note that $SF_6$ gas can be used instead of the mixture gas of $SF_6$ and $N_2$. Then, the photoresist pattern 805 is removed by using a dry etching process using oxygen plasma.

Figure 8F:
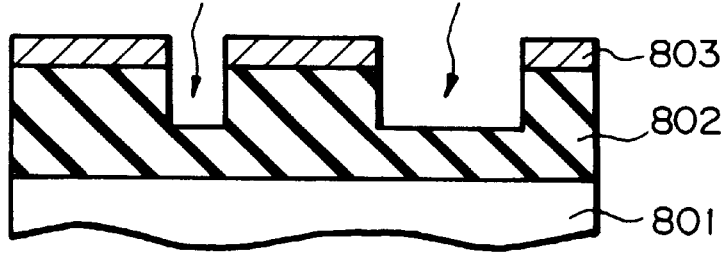

Next, referring to FIG. 8F, a part of the silicon oxide layer 802 is etched by a dry etching process using a mixture gas of $CHF_3$ and $H_2$ where the gas flow rate of $H_2/(CHF_3+H_2)$ is 10 percent, the plasma power is 50 W and the gas pressure is 3 mTorr. That is, a reactive ion etching process is carried out, so that openings 802a and 802b having a depth of about 150 nm are perforated in the silicon oxide layer 802. In this case, $H_2$ gas reduces F-radicals in $CHF_3$ plasma gas to reduce the etching rate of W. As a result, the etching rate ratio of the silicon oxide layer 802 to the w layer 803 is larger than 10/1. Therefore, since the W layer 803 is hardly etched, the W layer 803 can be thin, so that an aspect ratio of the opening 802b including the opening 803b of the w layer 803 can be reduced. This can suppress the reduction of the etching rate of the silicon oxide layer 802 as compared with the prior art methods where a photoresist pattern is directly used to etch the silicon oxide layers 102 and 402 of FIGS. 1A through 1H and FIGS. 4A through 4I.

Figure 8G:
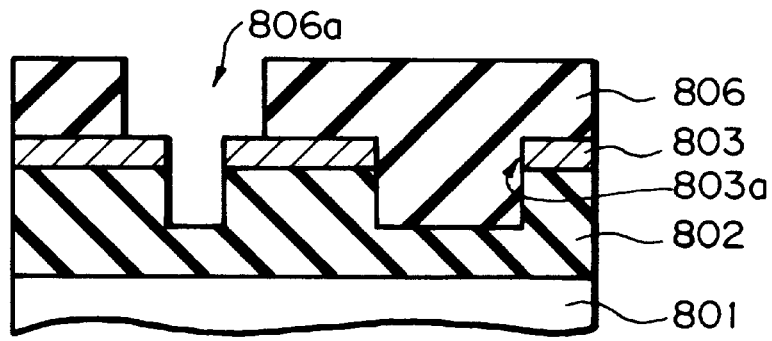

Next, referring to FIG. 8G, an about 300 nm thick photoresist pattern 806 made of PMMA having an opening 806a is again coated on the W layer 803. In this case, the opening 806a has a length of about 0.35 μm, and is formed by an electron-beam exposure system or an X-ray exposure system in accordance with using the opening 803a, i.e., the second opening as an alignment mark.

Figure 8H:
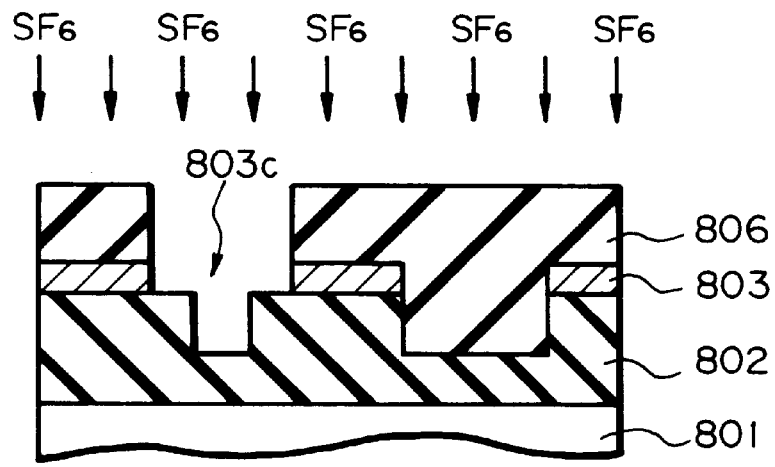

Next, referring to FIG. 8H, the W layer 803 is etched by a dry etching process using a mixture gas of $SF_6$ where the power is 50 W and the gas pressure is 3 mTorr. As a result, an opening 803c larger than the opening 803b is perforated in the W layer 803. Note that since the openings 803b and 803c are perforated by using the second cross opening (not shown) as an alignment mark, a relative misalignment between the openings 803b and 803c hardly occurs. Then, the photoresist pattern 806 is removed by using a dry etching process using oxygen plasma.

Figure 8I:
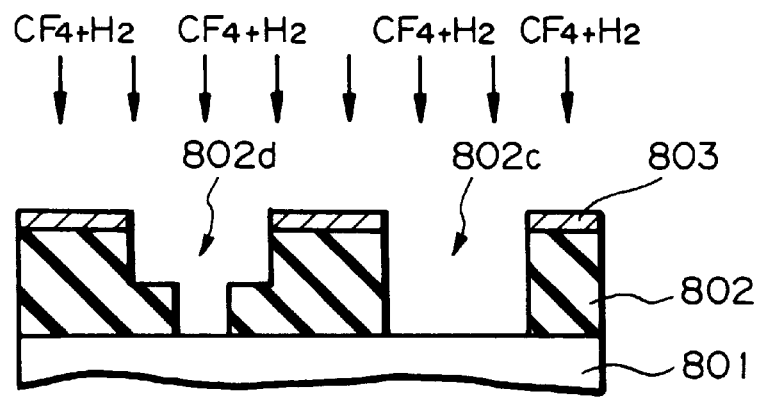

Next, referring to FIG. 8I, the silicon oxide layer 802 is etched by a dry etching process using a mixture gas of $CF_4$ and $H_2$ where the gas flow rate of $H_2/(CF_4+H_2)$ is 30 percent, the plasma power is 50 W and the gas pressure is 4 mTorr. That is, a reactive ion etching process is carried out, so that an opening 802c and a T-shaped opening 802d are perforated in the silicon oxide layer 802. In this case, the length of the opening 802c is larger than 0.5 μm.

Figure 8J:
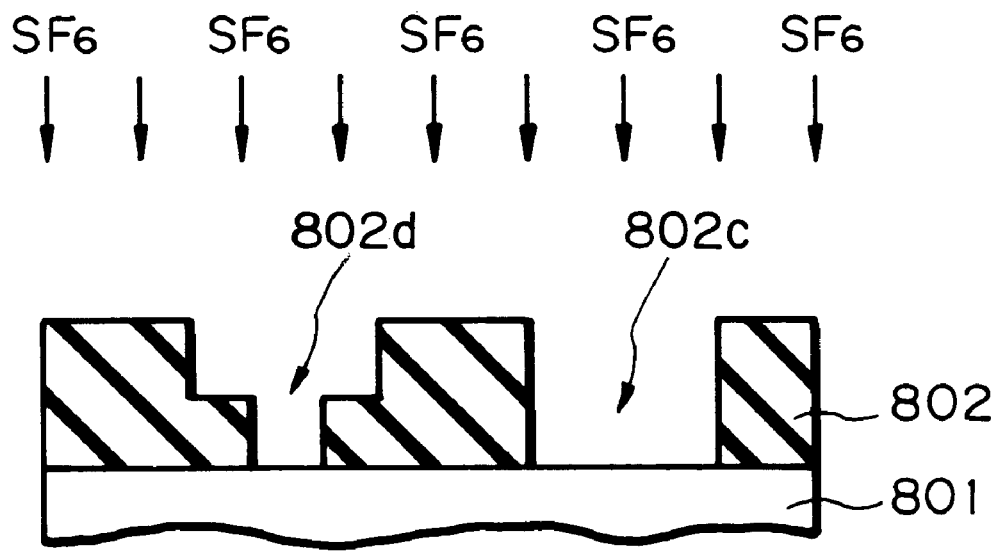

Next, referring to FIG. 8J, the W layer 803 is removed by a dry etching process using $SF_6$ gas.

Figure 8K:
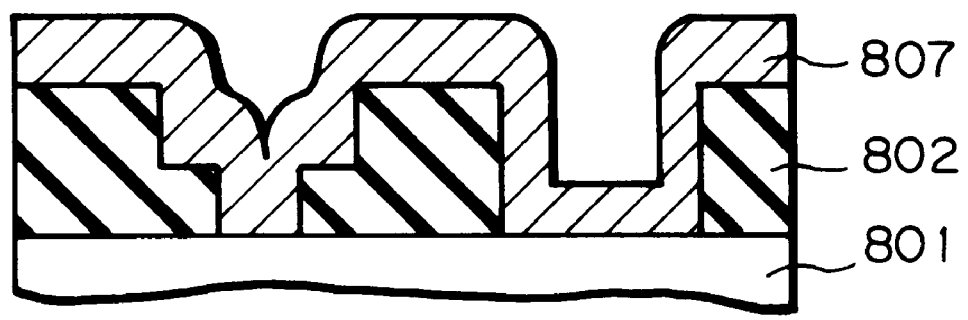

Next, referring to FIG. 8K, an about 30 nm thick WSi layer, an about 15 nm thick Ti layer and an about 300 nm thick Au layer are sequentially deposited on the entire surface by a sputtering process to form a gate metal layer 807.

Figure 8L:
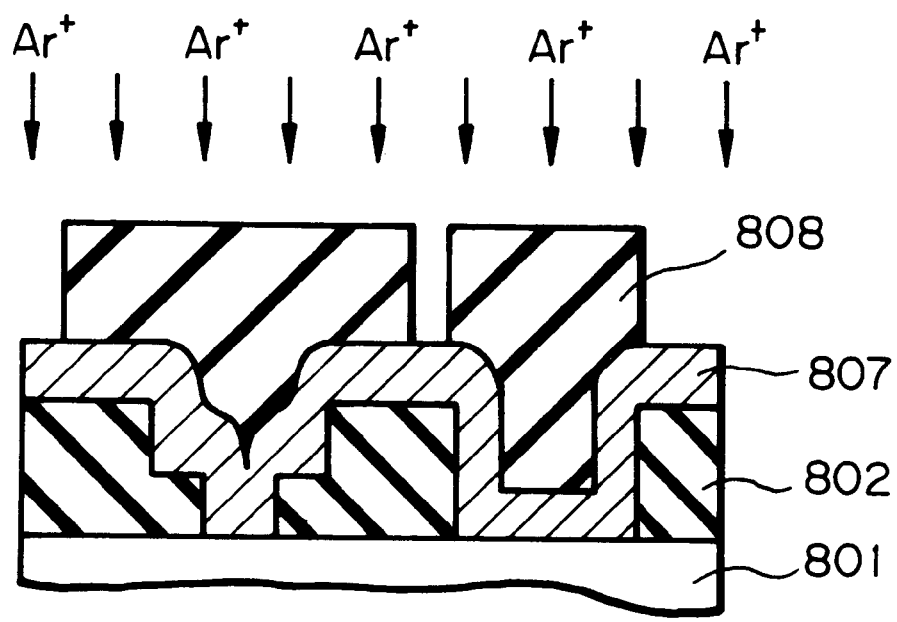

Next, referring to FIG. 8L, a photoresist pattern 808 is coated on the gate metal layer 807, and then, the gate metal layer 807 is etched by an ion milling process using the photoresist pattern 808 as a mask.

Figure 8M:
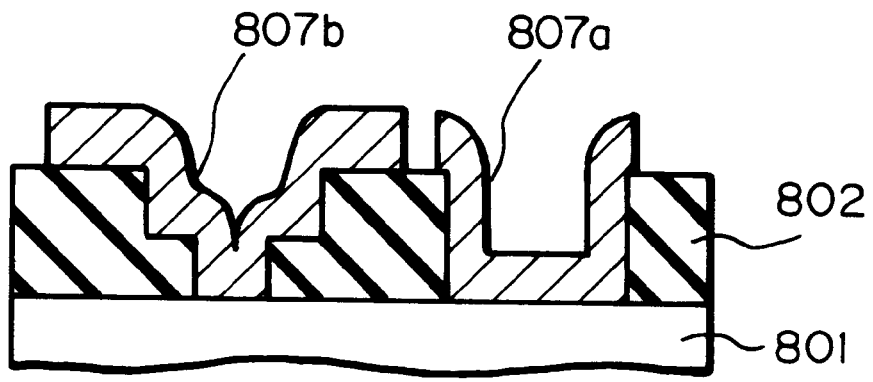

Finally, referring to FIG. 8M, the photoresist pattern 808 is removed, and thus, the gate metal layer 807 becomes an electrode 807a and a modified T-shaped gate electrode 807b.

In the third embodiments, the openings 805a and 806a having a length smaller than 0.5 μm are perforated by an electron-beam exposure system or an X-ray exposure system, while the opening 803a having a length larger than 0.5 μm is perforated by a photolithography process. This enhances the throughput.

Even in the third embodiment as illustrated in FIGS. 8A through 8M, in the lower portion of the opening 802d, since the aspect ratio is substantially small, the gate metal layer 807 is easily buried in the opening 802d of the silicon oxide layer 802 without causing the shadowing effect, i.e., causing cavity and disconnections as in the prior art. Also, since the silicon oxide layer 802 can be thick, a parasitic capacitance formed by the fringe portions of the modified T-shaped gate electrode 807b and the semiconductor substrate 801 can be decreased, thus suppressing the deterioration of the high frequency performance. Further, since the W layer 803 has an etching selectivity over the silicon oxide layer 802, a desirable shape of the modified T-shaped gate electrode 807b can be obtained.

Also, in the third embodiment, note that the W layer 803 can be replaced by another refractory metal layer made of Mo, tungsten alloy such as TiW, WSi or WN, or molybdenum alloy. Also, in the steps as illustrated in FIGS. 8F and 8I, a mixture gas of hydrofluorocarbon such as $CHF_3$ and hydrogen, a gas of hydrofluorocarbon or a fluorocarbon gas can be used as an etching gas having a large etching rate ratio of insulator made of silicon oxide, silicon nitride (SiN) or silicon oxide nitride (SiON) to refractory metal. Note that the layer 802 can be made of SiN or SiON.

FIGS. 9A through 9J are cross-sectional views for explaining a fourth embodiment of the method for manufacturing a semiconductor device according to the present invention.

Figure 9A:
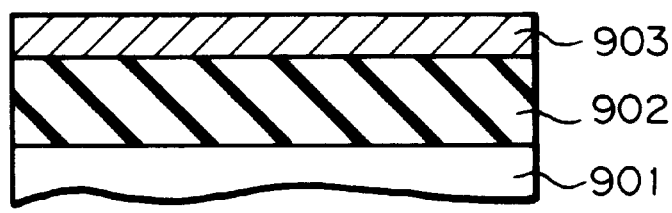
FIGS. 9A through 9J are cross-sectional views for explaining a fourth embodiment of the method for manufacturing a semiconductor device according to the present invention.

First, referring to FIG. 9A, an about 300 nm thick silicon oxide layer 902 is deposited on a semiconductor substrate 901 where active regions are already formed by a thermal CVD process. Then, an about 70 nm thick W layer 903 is deposited on the silicon oxide layer 902 by a sputtering process.

Figure 9B:
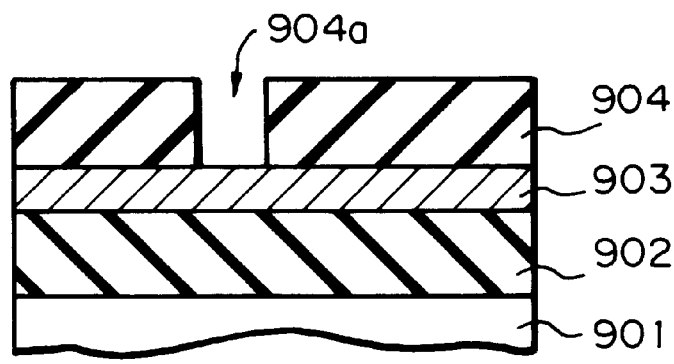

Next, referring to FIG. 9B, an about 200 nm thick photoresist pattern 904 made of PMMA having an opening 904a is coated on the W layer 903. In this case, the opening 904a has a length of about 0.1 μm, and is formed by an electron-beam exposure system or an X-ray exposure system.

Figure 9C:
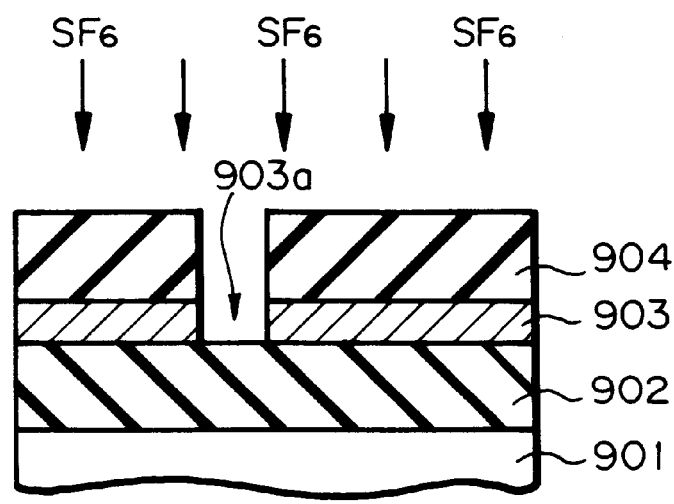

Next, referring to FIG. 9C, the W layer 903 is etched by a dry etching process using $SF_6$ gas where the power is 75 W and the gas pressure is 3 mTorr. As a result, an opening 903a is perforated in the W layer 903. In this case, the etching rate ratio of W to PMMA is larger than ½, and therefore, the photoresist pattern 904 is also hardly etched. However, note that a mixture of $SF_5$ and $N_2$ can be used instead of $SF_6$ gas. Then, the photoresist pattern 904 is removed by using a dry etching process using oxygen plasma.

Figure 9D:
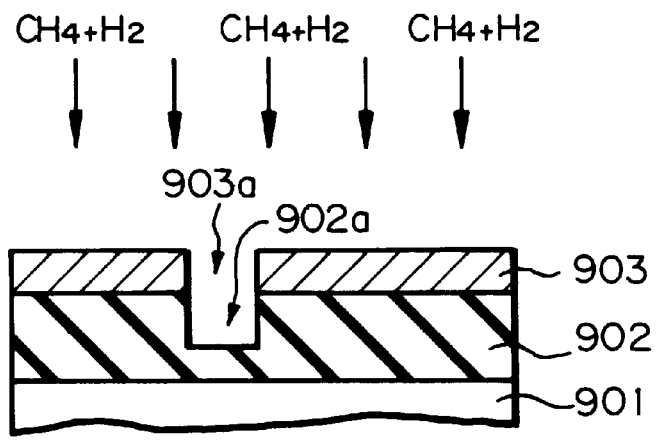

Next, referring to FIG. 9D, a part of the silicon oxide layer 902 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that an opening 902a having a depth of about 150 nm is perforated in the silicon oxide layer 902. In this case, since the W layer 903 is hardly etched, the W layer 903 can be thin, so that an aspect ratio of the opening 902a including the opening 903a of the W layer 903 can be reduced.

Figure 9E:
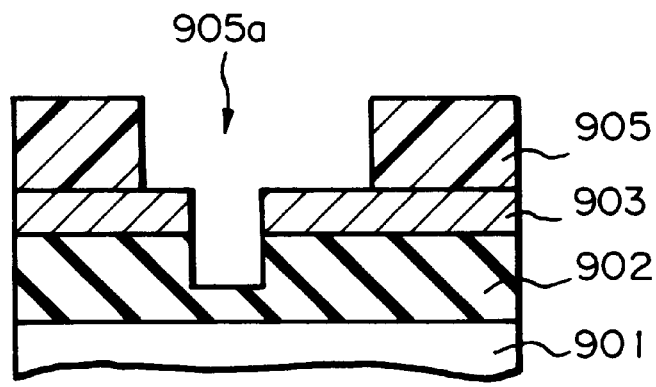

Next, referring to FIG. 9E, an about 300 nm thick photoresist pattern 905 made of PMMA having an opening 905a is again coated on the w layer 903. In this case, the opening 905a has a length of about 0.4 μm, and is formed by an electron-beam exposure or an X-ray exposure. Note that the opening 905a is shifted on the side of a drain region.

Figure 9F:
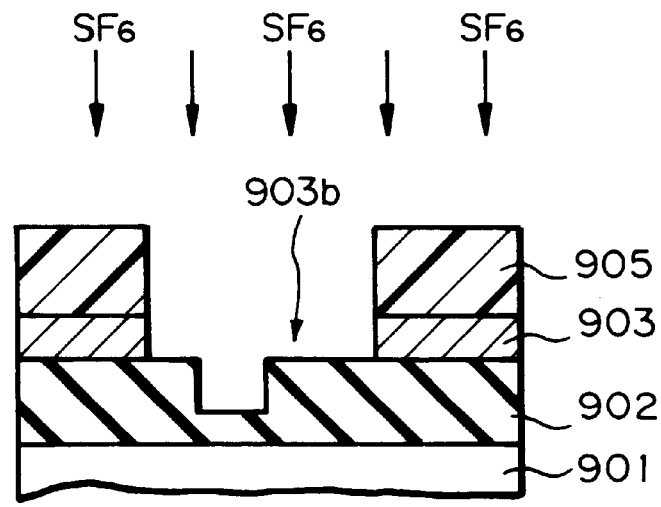

Next, referring to FIG. 9F, the W layer 903 is etched by a dry etching process using $SF_6$ where the power is 50 W and the gas pressure is 3 mTorr. As a result, an opening 903b larger than the opening 903a is perforated in the W layer 903. Then, the photoresist pattern 905 is removed by using a dry etching process using oxygen plasma.

Figure 9G:
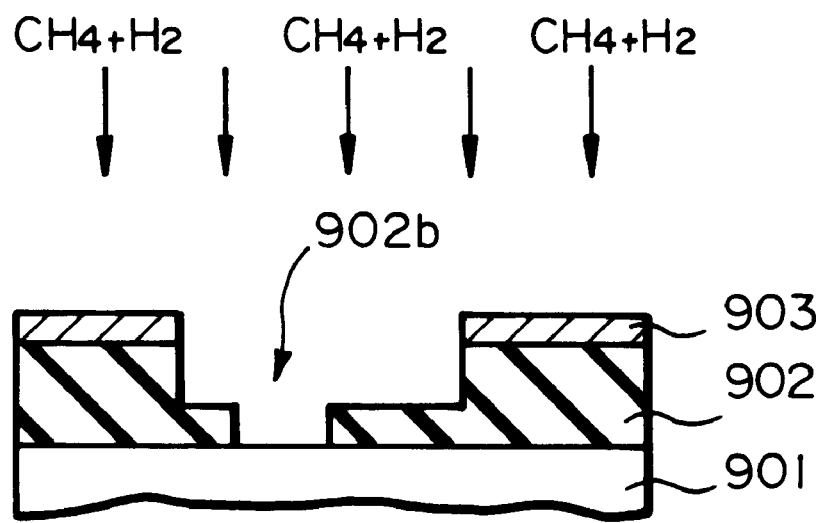
Figure 9H:
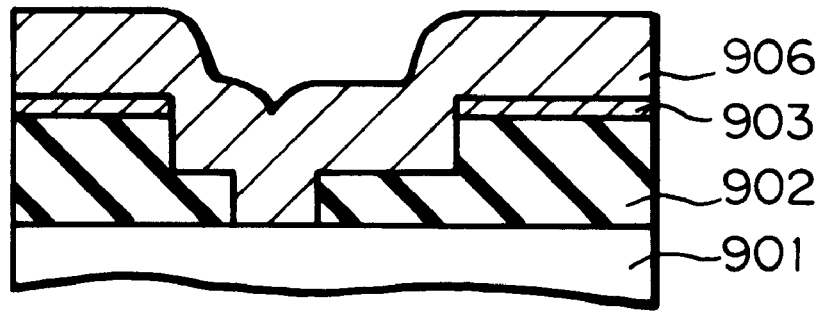

Next, referring to FIG. 9G, the silicon oxide layer 902 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that an asymmetrical T-shaped opening 902b is perforated in the silicon oxide layer 902.

Figure 9I:
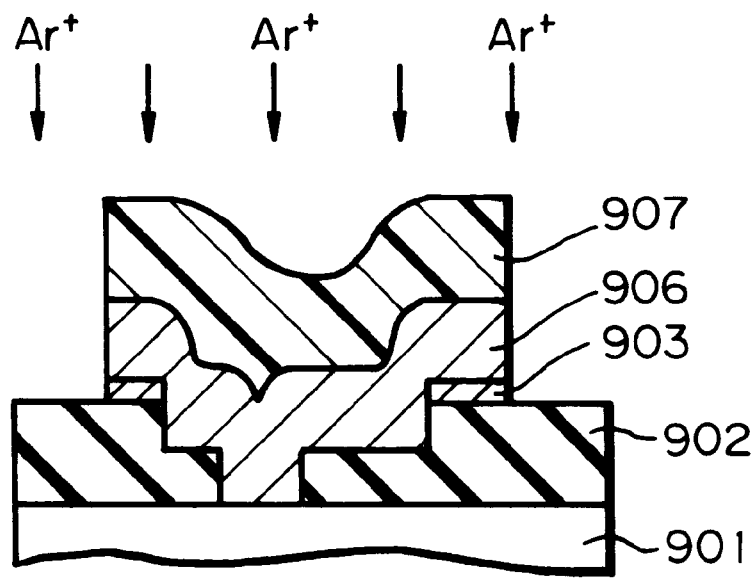

Next, referring to FIG. 9I, an about 35 nm thick WSi layer, an about 30 nm thick Ti layer and an about 300 nm thick Au layer are sequentially deposited on the entire surface by a sputtering process to form a gate metal layer 906.

Next, referring to FIG. 9I, a photoresist pattern 907 is coated on the gate metal layer 906, and then, the gate metal layer 906 is etched by an ion milling process using the photoresist pattern 907 as a mask. Then, the photoresist pattern 907 is removed, and thus, the gate metal layer 706 is of a modified T-shape.

Figure 9J:
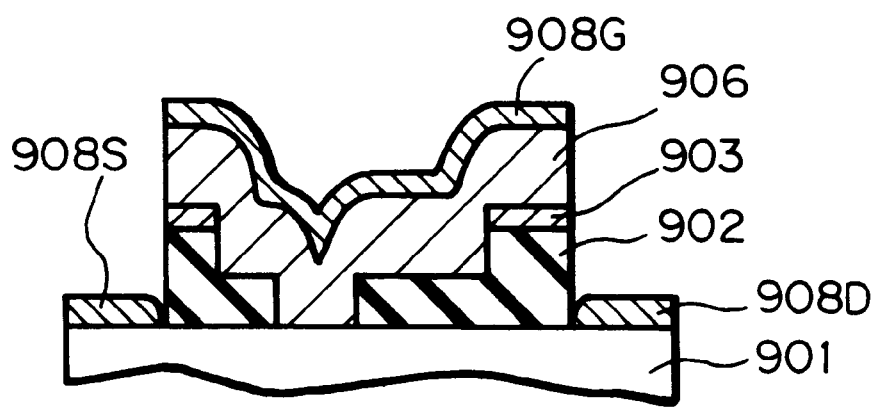

Finally, referring to FIG. 9J, an about 100 nm thick AuGe layer, an about 35 nm thick Ni layer and an about 20 nm thick Au layer are sequentially deposited by an evaporating process to form ohmic metal layers 908G, 908S and 908D. Then, a thermal treatment is performed thereupon at a temperature of about 450° C. for one minute, to complete a field effect transistor. Note that the ohmic metal layers 908S and 908D are connected to a source region and a drain region (not shown), respectively, of the semiconductor substrate 901.

In the fourth embodiment, since the modified T-shaped gate metal layer 906 is shifted to the source region, the drain breakdown voltage can be increased.

Even in the fourth embodiment as illustrated in FIGS. 9A through 9J, in the lower portion of the opening 902b, since the aspect ratio is substantially small, the gate metal layer 906 is easily buried in the opening 902b of the silicon oxide layer 902 without causing the shadowing effect, i.e., causing cavity and disconnections as in the prior art. Also, since the silicon oxide layer 902 can be thick, a parasitic capacitance formed by the fringe portions of the modified T-shaped gate metal layer 906 and the semiconductor substrate 901 can be decreased, thus suppressing the deterioration of the high frequency performance. Further, since the W layer 903 has an etching selectivity over the silicon oxide layer 902, a desirable shape of the gate metal layer 906 can be obtained.

In the fourth embodiment, note that the W layer 903 can be replaced by another refactory metal layer made of Mc, tungsten alloy such as TiW, WSi or WN, or molybdenum alloy. Also, in the steps as illustrated in FIGS. 9D and 9G, a mixture gas of fluorocarbon such as $C_3F_8$ and $C_2F_6$ and hydrogen, a mixture gas of hydrofluorocarbon such as $CHF_3$ and hydrogen, a gas of hydrofluorocarbon or a fluorocarbon gas except for $CF_4$ can be used as an etching gas having a large etching rate ratio of insulator made of silicon oxide, silicon nitride (SiN) or silicon oxide nitride (SiON) to refractory metal. Note that the layer 902 can be made of SiN or SiON.

Figure 10A:
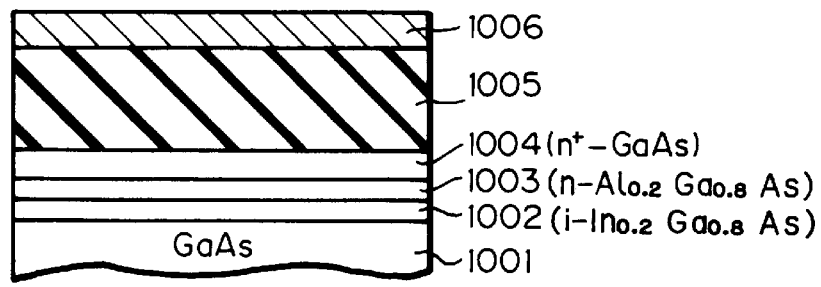
FIGS. 10A through 10N are cross-sectional views for explaining a fifth embodiment of the method for manufacturing a semiconductor device according to the present invention.
Figure 10B:
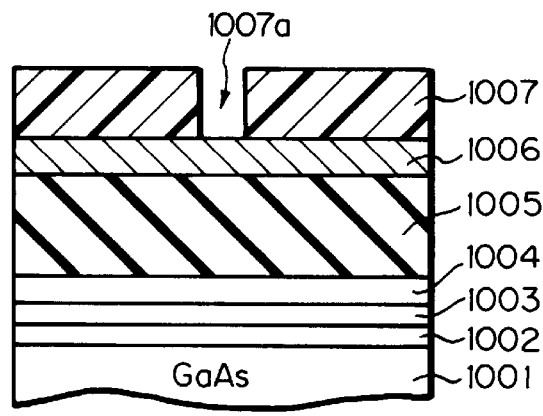
Figure 10C:
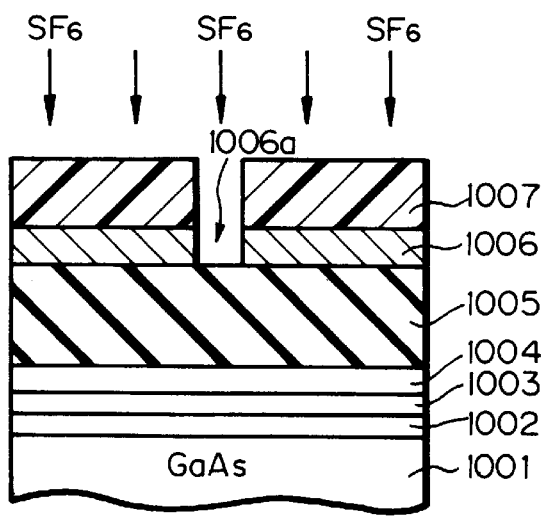
Figure 10D:
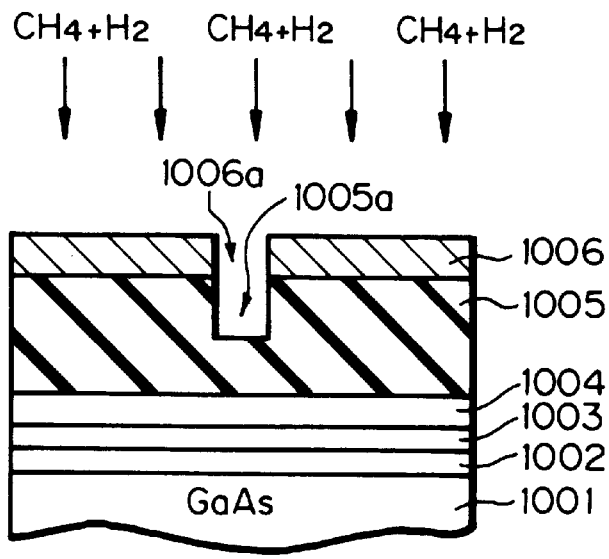
Figure 10E:
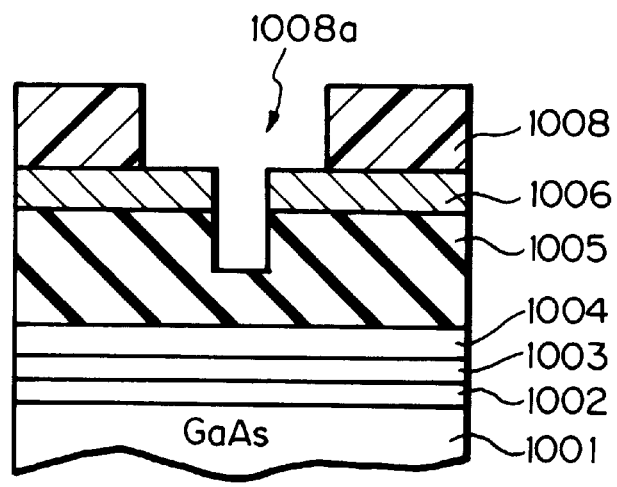
Figure 10F:
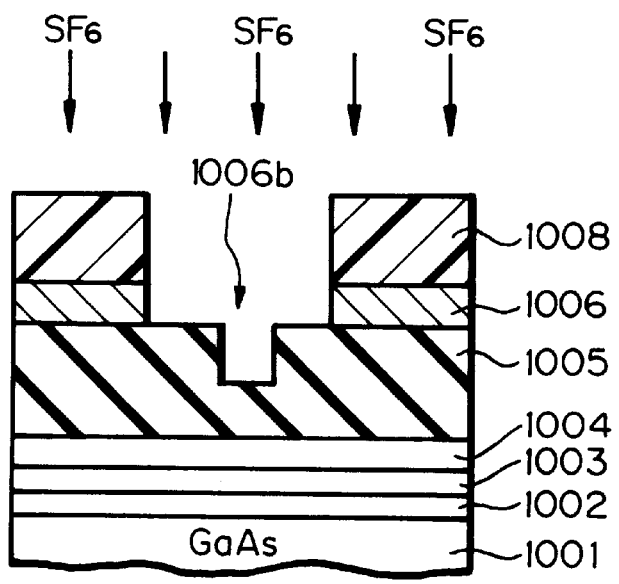
Figure 10G:
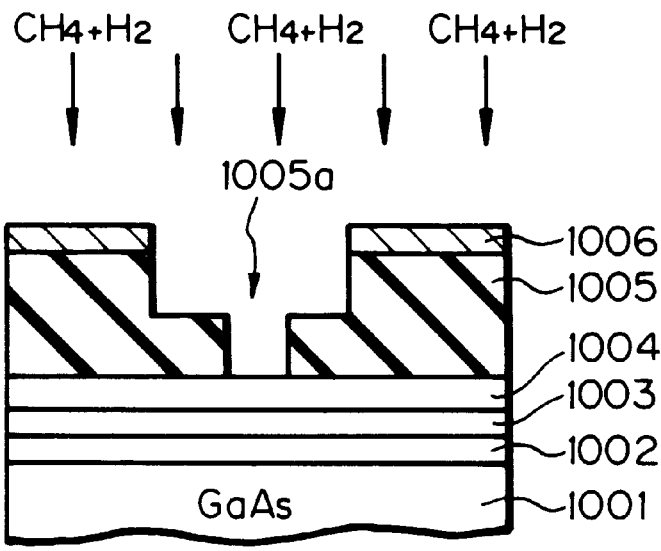
Figure 10H:
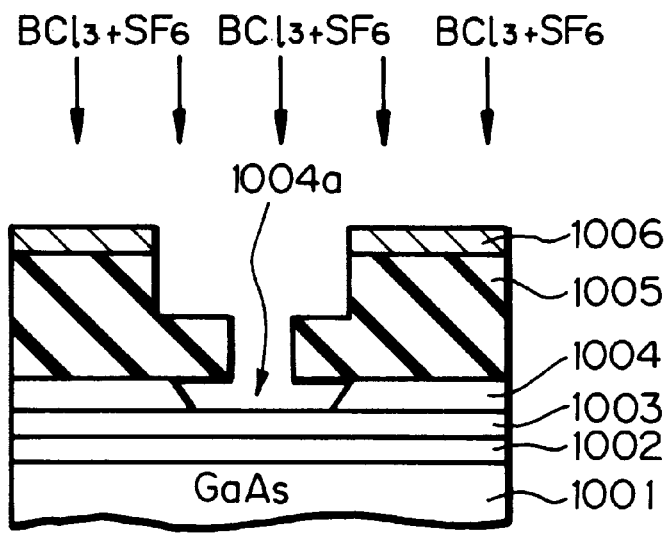
Figure 10I:
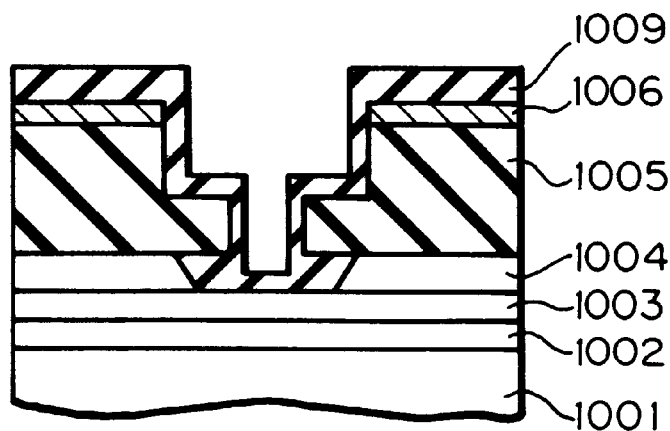
Figure 10J:
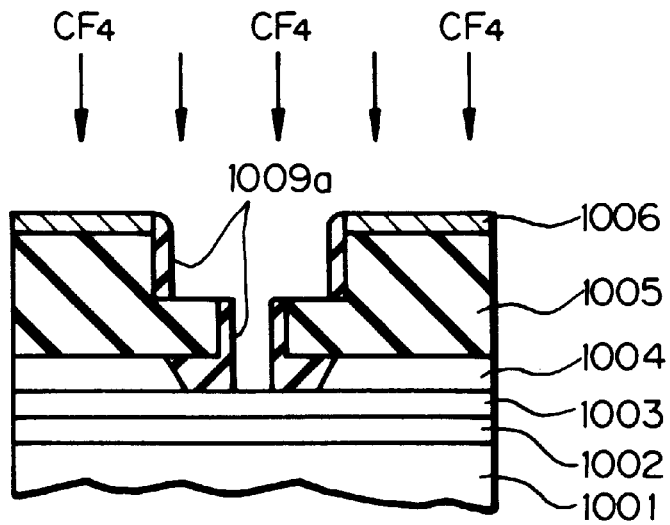
Figure 10K:
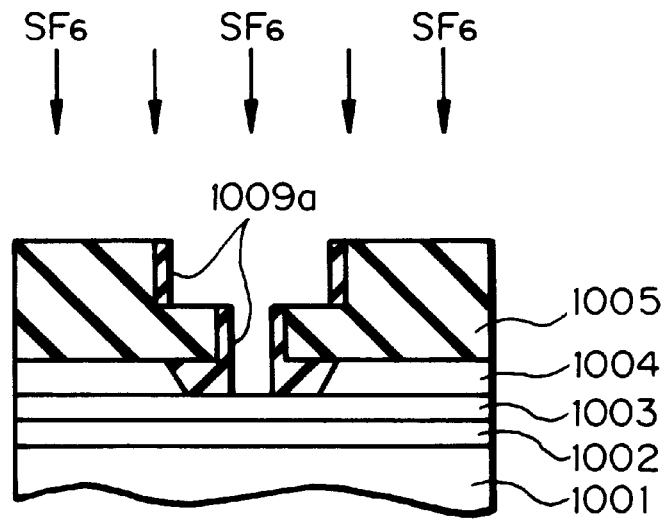
Figure 10L:
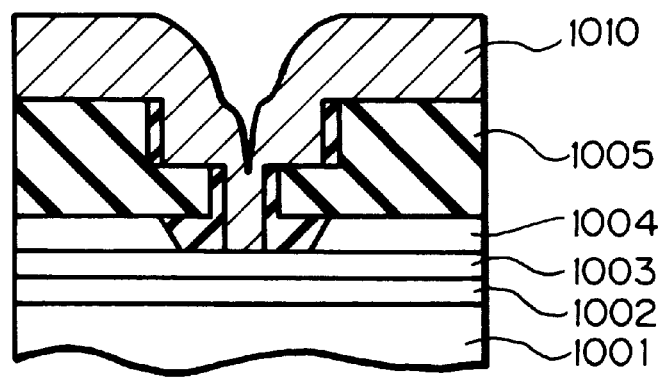
Figure 10M:
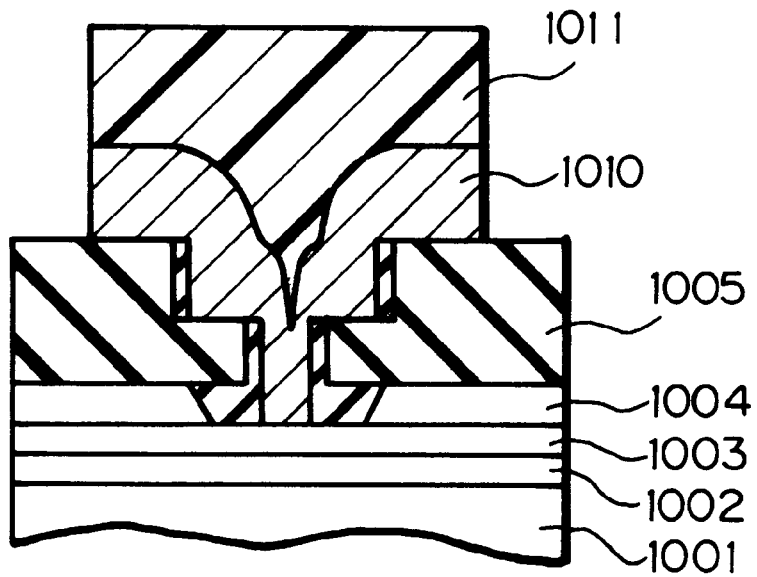
Figure 10N:
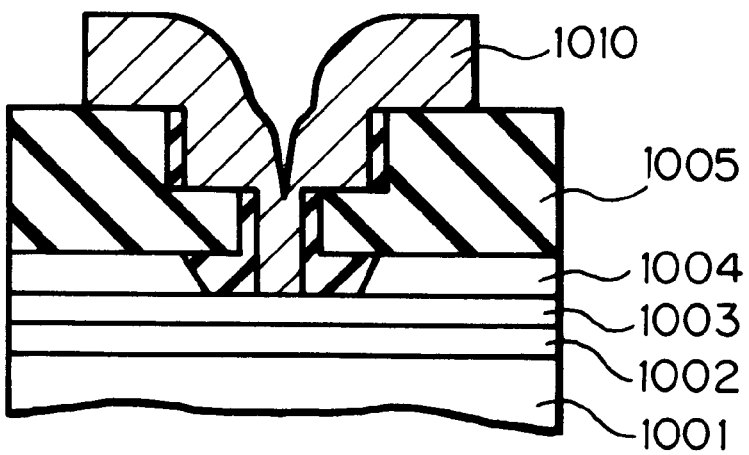

FIGS. 10A through 10N are cross-sectional views for explaining a fifth embodiment of the method for manufacturing a semiconductor device according to the present invention. The fifth embodiment is applied to a high electron mobility transistor (HEMT).

First, referring to FIG. 10A, grown on a semi-insulating Gabs substrate 1001 are an about 15 nm thick undoped $In_{0.2}Ga_{0.8}As$ channel layer 1002, an about 25 nm thick n-type $Al_{0.2}Ga_{0.8}As$ electron supply layer 1003 having an effective donor density of about $2 \times 10^{18}/cm^3$, and an about 30 nm thick n$^+$-type GaAs cap layer 1004 having an effective donor density of about $4.5 \times 10^{18}/cm^3$ by a molecular beam epitaxy (MBE) process or the like. Also, an about 330 nm thick silicon oxide layer 1005 is deposited on the cap layer 1004 by a plasma CVD process. Further, an about 80 nm thick W layer 1006 is deposited on the silicon oxide layer 1005 by a sputtering process.

Next, referring to FIG. 10B, an about 300 nm thick photoresist pattern 1007 made of PMMA and having an opening 1007a is coated on the W layer 1006. In this case, the opening 1007a has a length of about 0.1 μm, and is formed by an electron-beam exposure system or an X-ray exposure system.

Next, referring to FIG. 10C, the W layer 1006 is etched by a dry etching process using $SF_6$ gas where the power is 50 W and the gas pressure is 3 mTorr. As a result, an opening 1006a is perforated in the W layer 1006. In this case, the etching rate ratio of W to PMMA is larger than 2/1, and therefore, the photoresist pattern 1007 is also hardly etched. However, note that a mixture gas of $SF_6$ and $N_2$ can be used instead of $SF_6$ gas. Then, the photoresist pattern 1007 is removed by using a dry etching process using oxygen plasma.

Next, referring to FIG. 10D, a part of the silicon oxide layer 1005 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that an opening 1005a having a depth of about 200 nm is perforated in the silicon oxide layer 1005. In this case, $H_2$ gas reduces F-radicals in $CF_4$ plasma gas to reduce the etching rate of W. As a result, the etching rate ratio of the silicon oxide layer 1005 to the W layer 1006 is larger than 10/1. Therefore, since the W layer 1006 is hardly etched, the W layer 1006 can be thin, so that an aspect ratio of the opening 1005a including the opening 1006a of the W layer 1006 can be reduced. This can suppress the reduction of the etching rate of the silicon oxide layer 1005 as compared with the prior art methods where a photoresist pattern is directly used to etch the silicon oxide layers 102 and 402 of FIGS. 1A through 1H and FIGS. 4A through 4I.

Next, referring to FIG. 10E, an about 300 nm thick photoresist pattern 1008 made of PMMA having an opening 1008a is again coated on the W layer 1006. In this case, the opening 1008a has a length of about 0.4 μm, and is formed by an electron-beam exposure system or an X-ray exposure system.

Next, referring to FIG. 10F, the W layer 1006 is etched by a dry etching process using $SF_6$ gas where the power is 50 W and the gas pressure is 3 mTorr. As a result, an opening 1006b larger than the opening 1006a is perforated in the W layer 1006. Then, the photoresist pattern 1008 is removed by using a dry etching process using oxygen plasma.

Next, referring to FIG. 10G, the silicon oxide layer 1005 is etched by a dry etching process using a mixture gas of $CF_4$ and $H_2$ where the gas flow rate of $H_2/(CF_4+H_2)$ is 30 percent, the plasma power is 50 W and the gas pressure is 3 mTorr. That is, a reactive ion etching process is carried out, so that a T-shaped opening 1005b is perforated in the silicon oxide layer 1005.

Next, referring to FIG. 10H, the cap layer 1004 is etched by a dry etching process using a mixture gas of $BCl_3$ and $SF_6$. In this case, the silicon oxide layer 1005 and the W layer 1006 serve as a mask, and the electron supply layer 1003 serves as an etching stopper. As a result, a gate recess 1004a is perforated in the cap layer 1004.

Next, referring to FIG. 10I, an about 35 nm thick silicon oxide layer 1009 is deposited on the entire surface by a thermal CVD process.

Next, referring to FIG. 10J, the silicon oxide layer 1009 is etched back by a dry etching process using $CF_4$ gas where the power is 35 W and the gas pressure is 3 mTorr. That is, a reactive ion etching process is carried out, so that a sidewall silicon oxide layer 1009a is left on the sidewalls of the cap layer 1004 as well as the sidewalls of silicon oxide layer 1005. In this case, the W layer 1006 serves as an etching stopper, and the height of the silicon oxide layer 1005 is not reduced.

Next, referring to FIG. 10K, the W layer 1006 is removed by a dry etching process using $SF_6$ gas.

Next, referring to FIG. 10L, an about 35 nm thick WSi layer, an about 30 nm thick Ti layer and an about 300 nm thick Au layer are sequentially deposited on the entire surface by a sputtering process to form a gate metal layer 1010.

Next, referring to FIG. 10M, a photoresist pattern 1011 is coated on the gate metal layer 1010, and then, the gate metal layer 1010 is etched by an ion milling process using the photoresist pattern 1011 as a mask.

Finally, referring to FIG. 10N, the photoresist pattern 1010 is removed, and thus, the gate metal layer 1010 is of a modified T-shape.

Even in the fifth embodiment as illustrated in FIGS. 10A through 10N, in the lower portion of the opening 1006b, since the aspect ratio is substantially reduced, the gate metal layer 1010 is easily buried in the opening 1006b of the silicon oxide layer 1002 without causing the shadowing effect, i.e., causing cavity and disconnections as in the prior art. Also, since the silicon oxide layer 1005 can be thick, a parasitic capacitance formed by the fringe portions of the modified T-shaped gate metal layer 1010 and the semiconductor elements 1001 to 1008 can be decreased, thus suppressing the deterioration of the high frequency performance.

Further, since the W layer 1006 has an etching selectivity over the silicon oxide layer 1005, a desirable shape of the gate metal layer 1010 can be obtained.

In the fifth embodiment, note that the W layer 1006 can be replaced by another refractory metal layer made of Mo, tungsten alloy such as TiW, WSi or WN, or molybdenum alloy. Also, in the steps as illustrated in FIGS. 10D and 10G, a mixture gas of other fluorocarbon and hydrogen, a mixture gas of hydrofluorocarbon such as $CHF_3$ and hydrogen, a gas of hydrofluorocarbon or a fluorocarbon gas can be used as an etching gas having a large etching rate ratio of insulator made of silicon oxide, silicon nitride (SiN) or silicon oxide nitride (SiON) to refractory metal. Note that the layer 1005 can be made of SiN or SiON.

Figure 11A:
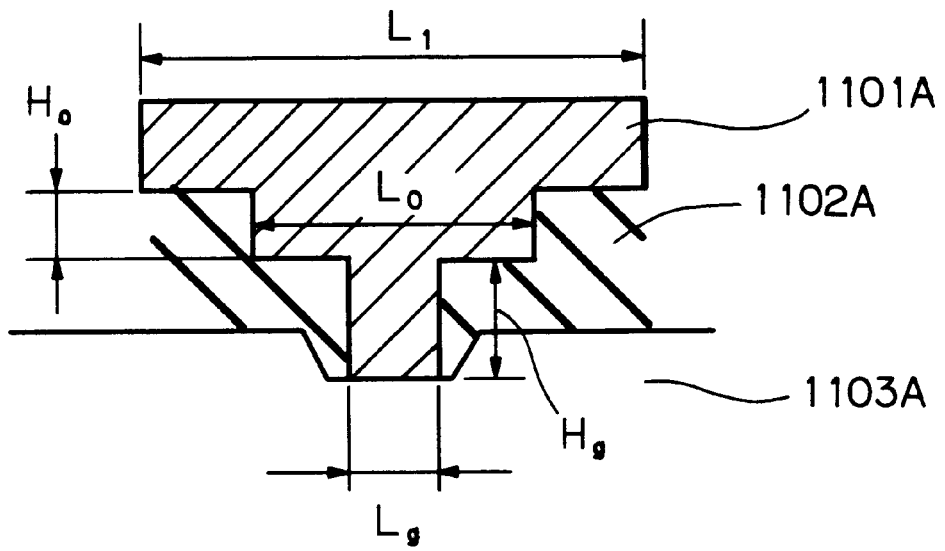
FIGS. 11A and 11B are cross-sectional views for explaining the effect of the present invention.
Figure 11B:
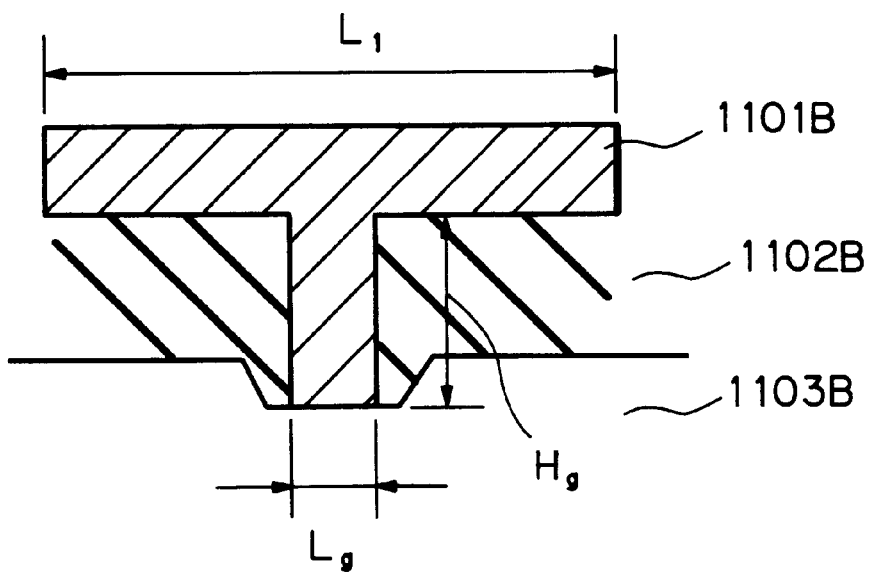

The effect of the present invention is explained in detail with reference to FIGS. 11A and 11B. That is, as illustrated in FIG. 11A, in the present invention, a modified T-shaped gate metal layer 1101A is formed via an insulating layer 1102A on a semiconductor substrate 1103A which also corresponds to the cap layer 1004 of the fifth embodiment. For example, the gate length $L_g$ is 0.1 $\mu$m and the gate height $H_g$ is 0.1 $\mu$m. In this case, the aspect ratio ($=H_g/L_g$) is 1. Also, for example, $L_0$=0.4 $\mu$m, $L_1$=0.9 $\mu$m and $H_0$=0.27 $\mu$m. In this case, the aspect ratio ($=H_0/L_0$) is 0.7. Therefore, the two aspect ratios are small, and therefore, the aspect ratio of the gate metal layer 1101A can be substantially small. As a result, the gate metal layer 1101A can be of a modified T-shape without causing cavity and disconnections therein. This enhances the manufacturing yield. On the other hand, as illustrated in FIG. 11B, in the prior art, a T-shaped gate metal layer 1101B is formed via an insulating layer 1102B on a semiconductor substrate 1103B. For example, the gate length $L_g$ is 0.1 $\mu$m and the gate height $H_g$ is 0.3 $\mu$m. In this case, the aspect ratio ($=H_g/L_g$) is thrice that of the present invention. As a result, the gate metal layer 1101B of a modified T-shape may cause cavity and disconnections therein. This reduces the manufacturing yield.

Figure 12:
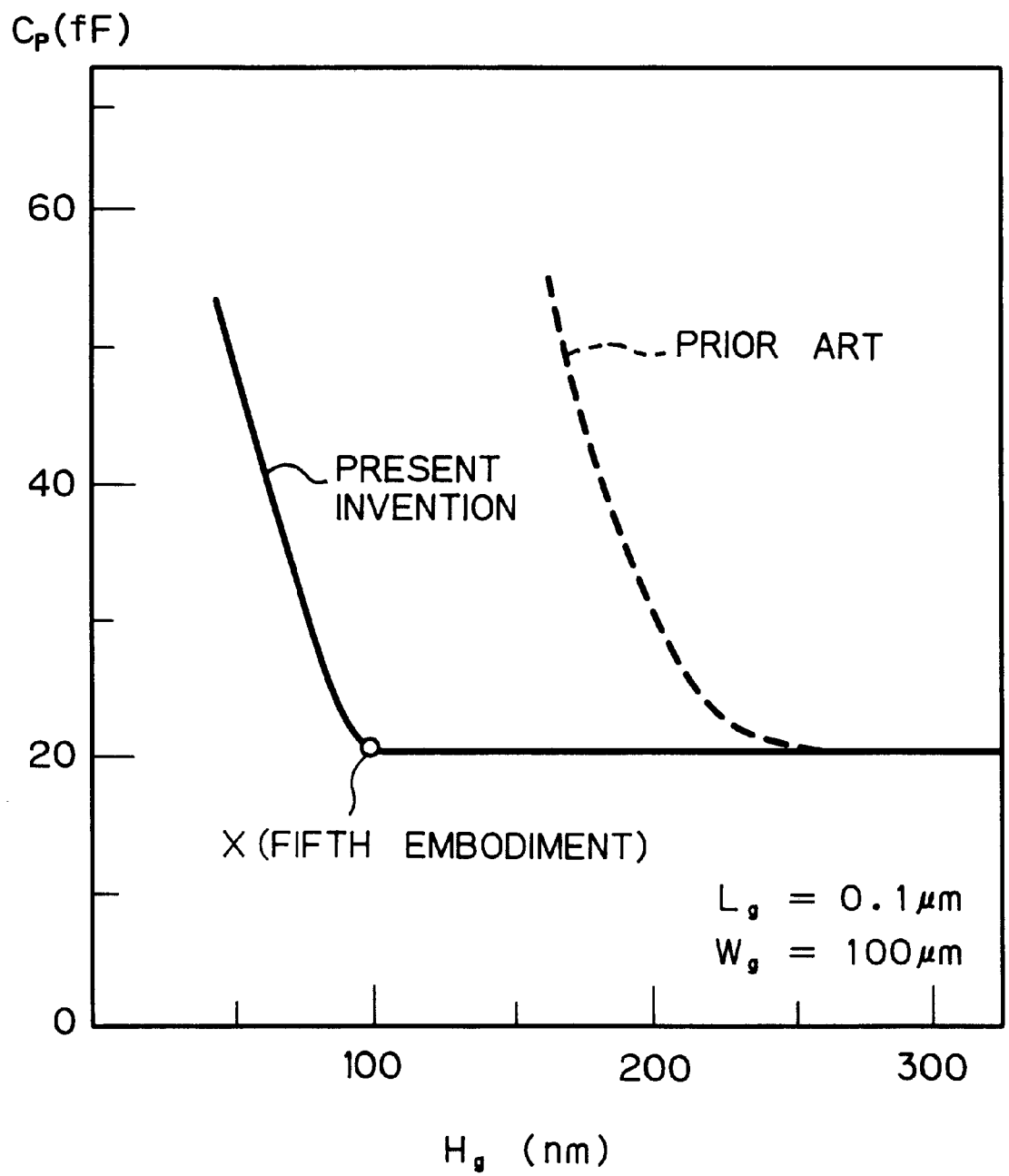
FIG. 12 is a graph showing the effect of the present invention.

In addition, if $L_g$ is 0.1 $\mu$m and the gate width $W_g$ is 100 $\mu$m, a parasitic capacitance $C_p$ formed by the fringe portion of a modified T-shaped gate metal layer (the present invention) is shown by a solid line in FIG. 12, and a parasitic capacitance $C_p$ formed by the fringe portions of a T-shaped gate metal layer (prior art) is shown by a dotted line in FIG. 12. Note that a point X on the solid line is actually obtained by the second embodiment. As shown in FIG. 12, if $L_g$=0.1 $\mu$m and $W_g$=100 $\mu$m, a minimum value of the parasitic capacitance $C_g$ is 20 fF. In order to realize this minimum value, the gate height $H_g$ of the present invention is at least 100 nm ($H_g/L_g$=1), and the gate height of the prior art is at least 250 nm ($H_g/L_g$=2.5).

As explained hereinabove, according to the present invention, since a modified T-shape gate metal layer can be formed without voids and disconnections, the manufacturing yield can be enhanced. Also, since the parasitic capacitance caused by the fringe portion of the modified T-shaped gate metal layer can be reduced, the high frequency performance can be improved.

What is claimed is:

1. A method for manufacturing a semiconductor device comprising the steps of:

forming an insulating layer on a semiconductor substrate;

forming a refractory metal layer on said insulating layer;

forming an alignment mark pattern on said refractory metal layer;

coating a first photoresist layer on said refractory metal layer after said alignment mark pattern is formed;

perforating a first opening in said photoresist layer by one of an electron-beam exposure system and an X-ray exposure system in accordance with said alignment mark pattern;

etching said refractory metal layer by a first dry etching process using one of $SF_6$ gas and a mixture gas of $SF_6$ and $N_2$ with said first photoresist layer having said first opening as a mask, so that a second opening is perforated in said refractory metal layer;

removing said first photoresist layer after said second opening is perforated in said refractory metal layer;

etching a part of said insulating layer by a second dry etching process using said refractory metal layer having said second opening as a mask, coating a second photoresist layer on said refractory metal layer after said insulating layer is partly etched;

perforating a third opening in said second photoresist layer by one of an electron-beam exposure system and an X-ray exposure system in accordance with said alignment mark pattern, said third opening being superposed onto said first and second openings and being larger than said first and second openings;

etching said refractory metal layer by a third dry etching process using one of $SF_6$ gas and a mixture of $SF_6$ and $N_2$ with said second photoresist layer having said third opening as a mask, so that a fourth opening is perforated in said refractory metal layer;

removing said second photoresist layer after said fourth opening is perforated in said refractory metal layer;

etching said insulating layer by a fourth dry etching process using said refractory metal layer having said fourth opening as a mask, so that a T-shaped opening is perforated in said insulating layer;

removing said refractory metal layer by a fifth dry etching process using one of $SF_6$ gas and a mixture gas of $SF_6$ and $N_2$, after said T-shaped opening is perforated;

forming a gate metal layer on said insulating layer after said refractory metal layer is removed; and patterning said gate metal layer into a modified T-shaped gate electrode.

2. The method as set forth in claim 1, wherein said insulating layer is made of one of silicon oxide, silicon nitride and silicon oxide nitride.

3. The method as set forth in claim 1, wherein said refractory metal layer is made of one of tungsten, molybdenum, tungsten alloy and molybdenum alloy.

4. The method as set forth in claim 1, wherein each of said second and fourth dry etching processes uses an etching gas including one of:

a mixture gas of fluorocarbon and hydrogen;

a mixture gas of hydrofluorocarbon and hydrogen;

a gas of hydrofluorocarbon; and a fluorocarbon gas.

5. A method for manufacturing a semiconductor device comprising the steps of;

forming an insulating layer on a semiconductor substrate;

forming a refractory metal layer on said insulating layer;

coating a first photoresist layer on said refractory metal layer;

perforating a first opening in said photoresist layer by a photolithography process;

etching said refractory metal layer by a first dry etching process using one of $SF_6$ gas and a mixture gas of $SF_6$ and $N_2$ with said first photoresist layer having said first opening as a mask, so that a second opening is perforated in said refractory metal layer;

removing said first photoresist layer after said second opening is perforated in said refractory metal layer;

coating a second photoresist layer on said refractory metal layer after said first photoresist layer is removed;

perforating a third opening in said photoresist layer by one of an electron-beam exposure system and an X-ray exposure system in accordance with said second opening as an alignment mark;

etching said refractory metal layer by a second dry etching process using one of $SF_6$ gas and a mixture gas of $SF_6$ and $N_2$ with said second photoresist layer having said third opening as a mask, so that a fourth opening is perforated in said refractory metal layer;

removing said second photoresist layer after said fourth opening is perforated in said refractory metal layer;

etching a part of said insulating layer by a third dry etching process using said refractory metal layer having said second and fourth openings as a mask, coating a third photoresist layer on said refractory metal layer after said insulating layer is partly etched;

perforating a fifth opening in said third photoresist layer by one of an electron-beam exposure system and an X-ray exposure system in accordance with said second opening as an alignment mark, said sixth opening being superposed onto said third and fourth openings and being larger than said third and fourth openings;

etching said refractory metal layer by a fourth dry etching process using one of $SF_6$ gas and a mixture of $SF_6$ and $N_2$ with said third photoresist layer having said fifth opening as a mask, so that a sixth opening is perforated in said refractory metal layer;

removing said third photoresist layer after said sixth opening is perforated in said refractory metal layer;

etching said insulating layer by a fifth dry etching process using said refractory metal layer having said second and sixth openings as a mask, so that a rectangular-shaped opening and a T-shaped opening are perforated in said insulating layer;

removing said refractory metal layer by a sixth dry etching process using one of $SF_6$ gas and a mixture gas of $SF_6$ and $N_2$, after said rectangular-shaped opening and said T-shaped opening are perforated;

forming a gate metal layer on said insulating layer after said refractory metal layer is removed; and patterning said gate metal layer into a T-shaped gate electrode and a modified T-shaped gate electrode.

6. The method as set forth in claim 5, wherein said insulating layer is made of one of silicon oxide, silicon nitride and silicon oxide nitride.

7. The method as set forth in claim 5, wherein said refractory metal layer is made of one of tungsten, molybdenum, tungsten alloy and molybdenum alloy.

8. The method as set forth in claim 5, wherein each of said third and fifth dry etching processes uses an etching gas including one of:

a mixture gas of fluorocarbon and hydrogen;

a mixture gas of hydrofluorocarbon and hydrogen;

a gas of hydrofluorocarbon; and a fluorocarbon gas.

9. A method for manufacturing a semiconductor device comprising the steps of:

forming an insulating layer on a semiconductor substrate;

forming a refractory metal layer on said insulating layer;

coating a first photoresist layer on said refractory metal layer;

perforating a first opening in said photoresist layer by one of an electron-beam exposure system and an X-ray exposure system;

etching said refractory metal layer by a first dry etching process using one of $SF_6$ gas and a mixture gas of $SF_6$ and $N_2$ with said first photoresist layer having said first opening as a mask, so that a second opening is perforated in said refractory metal layer;

removing said first photoresist layer after said second opening is perforated in said refractory metal layer;

etching a part of said insulating layer by a second dry etching process using said refractory metal layer having said second opening as a mask, coating a second photoresist layer on said refractory metal layer after said insulating layer is partly etched;

perforating a third opening in said second photoresist layer by one of an electron-beam exposure system and an X-ray exposure system, said third opening being superposed onto said first and second openings and being larger than said first and second openings, a center of said first and second opening being closer to a source region than a drain region, a center of said third opening being at an intermediate location between said source region and said drain region;

etching said refractory metal layer by a third dry etching process using one of $SF_6$ gas and a mixture of $SF_6$ and $N_2$ with said second photoresist layer having said third opening as a mask, so that a fourth opening is perforated in said refractory metal layer;

removing said second photoresist layer after said fourth opening is perforated in said refractory metal layer;

etching said insulating layer by a fourth dry etching process using said refractory metal layer having said fourth opening as a mask, so that an asymmetrical T-shaped opening is perforated in said insulating layer;

forming a gate metal layer on said insulating layer after said asymmetrical T-shaped opening is perforated;

patterning said gate metal layer into a modified T-shaped gate electrode;

patterning said insulating layer using said modified T-shaped gate electrode as a mask; and forming a source electrode and a drain electrode on said semiconductor substrate after said insulating layer is patterned.

10. The method as set forth in claim 9, wherein said insulating layer is made of one of silicon oxide, silicon nitride and silicon oxide nitride.

11. The method as set forth in claim 9, wherein said refractory metal layer is made of one of tungsten, molybdenum, tungsten alloy and molybdenum alloy.

12. The method as set forth in claim 9, wherein each of said second and fourth dry etching processes uses an etching gas including one of:

a mixture gas of fluorocarbon and hydrogen;

a mixture gas of hydrofluorocarbon and hydrogen;

a gas of hydrofluorocarbon; and a fluorocarbon gas.

13. A method for manufacturing a semiconductor device comprising the steps of:

forming a plurality of semiconductor layers on a semiconductor substrate;

forming a first insulating layer on said semiconductor layers;

forming a refractory metal layer on said first insulating layer;

coating a first photoresist layer on said refractory metal layer;

perforating a first opening in said photoresist layer by one of an electron-beam exposure system and an X-ray exposure system;

etching said refractory metal layer by a first dry etching process using one of $SF_6$ gas and a mixture gas of $SF_6$ and $N_2$ with said first photoresist layer having said first opening as a mask, so that a second opening is perforated in said refractory metal layer;

removing said first photoresist layer after said second opening is perforated in said refractory metal layer;

etching a part of said first insulating layer by a second dry etching process using said refractory metal layer having said second opening as a mask, coating a second photoresist layer on said refractory metal layer after said first insulating layer is partly etched;

perforating a third opening in said second photoresist layer by one of an electron-beam exposure system and an X-ray exposure system, said third opening being superposed onto said first and second openings and being larger than said first and second openings;

etching said refractory metal layer by a third dry etching process using one of $SF_6$ gas and a mixture of $SF_6$ and $N_2$ with said second photoresist layer having said third opening as a mask, so that a fourth opening is perforated in said refractory metal layer;

removing said second photoresist layer after said fourth opening is perforated in said refractory metal layer;

etching said first insulating layer by a fourth dry etching process using said refractory metal layer having said fourth opening as a mask, so that a T-shaped opening is perforated in said first insulating layer;

etching at least one of said semiconductor layers by a fifth dry etching process using said refractory metal layer and said insulating layer having said T-shaped opening as a mask and the semiconductor layers other than said at least one of said semiconductor layers as an etching stopper, so that a gate recess is formed within said at least one of said semiconductor layers;

forming a second insulating layer on the entire surface after said gate recess is formed;

etching back said second insulating layer by a sixth dry etching process, so that said second insulating layer is left on sidewalls of said first insulating layer within said T-shaped opening and sidewalls of said at least one of said semiconductor layers within said gate recess;

forming a gate metal layer on said insulating layer after said etching back step is completed; and patterning said gate metal layer into a modified T-shaped gate electrode.

14. The method as set forth in claim 13, wherein each of said first and second insulating layers is made of one of silicon oxide, silicon nitride and silicon oxide nitride.

15. The method as set forth in claim 13, wherein said refractory metal layer is made of one of tungsten, molybdenum, tungsten alloy and molybdenum alloy.

16. The method as set forth in claim 13, wherein each of said second, fourth and sixth dry etching processes uses an etching gas including one of:

a mixture gas of fluorocarbon and hydrogen;

a mixture gas of hydrofluorocarbon and hydrogen;

a gas of hydrofluorocarbon; and a fluorocarbon gas.

17. A method for manufacturing a semiconductor device comprising the steps of:

forming an insulating layer on a semiconductor substrate;

forming a refractory metal layer on said insulating layer;

forming an alignment mark layer on said refractory metal layer;

perforating a first opening in said refractory metal layer;

etching a part of said insulating layer by using said refractory metal layer having said first opening as a mask;

perforating a second opening in said refractory metal layer, said second opening being superposed onto said first opening and being larger than said first opening;

etching said insulating layer by using said refractory metal layer having said second opening as a mask, so that a T-shaped opening is perforated in said insulating layer; and forming a modified T-shaped gate metal electrode on said insulating layer having said T-shaped opening;

wherein said first insulating layer perforating step comprises the steps of:

coating a first photoresist layer on said insulating layer;

patterning said first photoresist layer by using one of an electron-beam exposure system and an X-ray exposure system; and etching said refractory metal layer by a dry etching process using one of $SF_6$ gas and a mixture gas of $SF_6$ and $N_2$ with said patterned first photoresist layer as a mask, so that said first opening is perforated in said refractory metal layer, said second insulating layer perforating step comprises the steps of:

coating a second photoresist layer on said insulating layer;

patterning said second photoresist layer by using one of an electron-beam exposure system and an X-ray exposure system; and etching said refractory metal layer by a dry etching process using one of $SF_6$ gas and a mixture gas of $SF_6$ and $N_2$ with said patterned second photoresist layer as a mask, so that said second opening is perforated in said refractory metal layer;

said one of the electron-beam exposure system and the X-ray exposure system being operated in accordance with said alignment mark layer.

18. The method for manufacturing a semiconductor device comprising the steps of:

forming an insulating layer on a semiconductor substrate;

forming a refractory metal layer on said insulating layer;

perforating a first opening in said refractory metal layer;

etching a part of said insulating layer by using said refractory metal layer having said first opening as a mask;

perforating a second opening in said refractory metal layer, said second opening being superposed onto said first opening and being larger than said first opening;

etching said insulating layer by using said refractory metal layer having said second opening as a mask, so that a T-shaped opening is perforated in said insulating layer; and forming a modified T-shaped gate metal electrode on said insulating layer having said T-shaped opening;

wherein said first insulating layer perforating step comprises the steps of:

coating a first photoresist layer on said insulating layer;

patterning said first photoresist layer by using one of an electron-beam exposure system and an X-ray exposure system; and etching said refractory metal layer by a dry etching processing using one of $SF_6$ gas and a mixture gas of $SF_6$ and $N_2$ with said patterned first photoresist layer as a mask, so that said first opening is perforated in said refractory metal layer, said second insulating layer perforating step comprises the steps of:

coating a second photoresist layer on said insulating layer;

patterning said second photoresist layer by using one of an electron-beam exposure system and an X-ray exposure system;

etching said refractory metal layer by a dry etching process using one of $SF_6$ gas mixture and a mixture gas of $SF_6$ and $N_2$ with said patterned second photoresist layer as a mask, so that said second opening is perforated in said refractory metal layer; and further comprising the steps of:

coating a third photoresist layer on said insulating layer;

patterning said third photoresist layer by a photolithography process;

etching said refractory metal layer by a dry etching processing using one of $SF_6$ gas and a mixture of $SF_6$ and $N_2$ with said patterned third photoresist layer, so that an alignment mark is formed in said refractory metal layer, said one of the electron-beam exposure system and the X-ray exposure system being operated in accordance with said alignment mark.

19. A method for manufacturing a semiconductor device comprising the steps of:

forming an insulating layer on a semiconductor substrate;

forming a refractory metal layer on said insulating layer;

perforating a first opening in said refractory metal layer;

etching a part of said insulating layer by using said refractory metal layer having said first opening as a mask;

perforating a second opening in said refractory metal layer, said second opening being superposed onto said first opening and being larger than said first opening;

etching said insulating layer by using said refractory metal layer having said second opening as a mask, so that a T-shaped opening is perforated in said insulating layer; and forming a modified T-shaped gate metal electrode on said insulating layer having said T-shaped opening;

wherein a center of said second opening is shifted from a center of said first opening, so that a distance between a drain electrode and the center of said first opening is larger than a distance between a source electrode and the center of said first opening.

20. A method for manufacturing a semiconductor device comprising the steps of:

forming an insulating layer on a semiconductor substrate;

forming a refractory metal layer on said insulating layer;

perforating a first opening in said refractory metal layer;

etching a part of said insulating layer by using said refractory metal layer having said first opening as a mask;

perforating a second opening in said refractory metal layer, said second opening being superposed onto said first opening and being larger than said first opening;

etching said insulating layer by using said refractory metal layer having said second opening as a mask, so that a T-shaped opening is perforated in said insulating layer;

forming a modified T-shaped gate metal electrode on said insulating layer having said T-shaped opening; and, further comprising the steps of:

forming at least one semiconductor layer on said semiconductor substrate before said insulating layer is formed, said insulating layer being formed on said semiconductor layer;

etching said semiconductor layer using said refractory metal layer and said etched insulating layer as a mask after said T-shaped opening is formed, so that a gate recess is formed in said semiconductor layer;

forming a sidewall insulating layer on sidewalls of said insulating layer and said etched semiconductor layer, said modified T-shaped gate metal layer being formed on said sidewall insulating layer.

* * * * *

UNITED STATES PATENT AND TRADEMARK OFFICE
CERTIFICATE OF CORRECTION

PATENT NO.    : 6,087,256
DATED         : July 11, 2000
INVENTOR(S)   : Shigeki Wada It is certified that error appears in the above-identified patent and that said Letters Patent is hereby corrected as shown below:

Column 19,
Line 43, insert a space after "$SF_6$"

Signed and Sealed this

Third Day of December, 2002

JAMES E. ROGAN
*Director of the United States Patent and Trademark Office*